(12) United States Patent
Mizuno et al.

(10) Patent No.: US 8,076,846 B2
(45) Date of Patent: Dec. 13, 2011

(54) METAL OXIDE NANOPARTICLES, PRODUCTION METHOD THEREOF, LIGHT-EMITTING ELEMENT ASSEMBLY, AND OPTICAL MATERIAL

(75) Inventors: Mikihisa Mizuno, Miyagi (JP); Yuichi Sasaki, Miyagi (JP); Sung-Kil Lee, Miyagi (JP); Hitoshi Katakura, Miaygi (JP)

(73) Assignee: Sony Corporation, Tokyo (JP)

( * ) Notice: Subject to any disclaimer, the term of this patent is extended or adjusted under 35 U.S.C. 154(b) by 344 days.

(21) Appl. No.: 11/534,127

(22) Filed: Sep. 21, 2006

(65) Prior Publication Data
US 2010/0117503 A1    May 13, 2010

(30) Foreign Application Priority Data

Sep. 22, 2005 (JP) ................. 2005-275141
Jan. 6, 2006 (JP) ................. 2006-001090
May 10, 2006 (JP) ................. 2006-131670

(51) Int. Cl.
*H01J 1/62* (2006.01)
*H01J 63/04* (2006.01)

(52) U.S. Cl. ........ 313/512; 313/498; 313/499; 313/501; 313/502; 252/582; 252/584; 257/100; 428/402; 428/402.24; 428/403

(58) Field of Classification Search ................. 313/491, 313/498, 501, 512, 499, 502; 252/582, 584; 257/100; 428/402, 202.24, 403
See application file for complete search history.

(56) References Cited

U.S. PATENT DOCUMENTS

| 6,870,311 B2* | 3/2005 | Mueller et al. ................. 313/491 |
| 2002/0001716 A1* | 1/2002 | Barbera-Guillem ..... 428/402.24 |
| 2005/0036938 A1* | 2/2005 | Hyeon ........................ 423/561.1 |
| 2005/0063898 A1* | 3/2005 | Ja Chisholm ................. 423/608 |
| 2007/0087195 A1* | 4/2007 | Meyer et al. .................. 428/403 |

FOREIGN PATENT DOCUMENTS

| JP | 60-166203 | 8/1985 |
| JP | 64-018904 | 1/1989 |

(Continued)

OTHER PUBLICATIONS

Japanese Office Action dated Aug. 11, 2009, for corresponding JP Patent Application 2006-131670.
Woudenberg et al., "Dense Nanostructured t-Zro2 Coatings at Low Temperatures via Modified Emulsion Precipitation,"Adv. Mater. Apr. 4, 2001, 13, No. 7, pp. 514-516.
Joo et al., "Multigram Scale Synthesis and Characterization of Monodisperse Tetragonal Zirconia Nanocrystals," J. Am. Chem. Soc. 2003, 125, pp. 6553-6557.
Griesmar et al., "Sol-Gel Route to Niobium Pentoxide," Chem. Mater. 1991, 3, pp. 335-339.

*Primary Examiner* — Nimeshkumar Patel
*Assistant Examiner* — Thomas A Hollweg
(74) *Attorney, Agent, or Firm* — K&L Gates LLP

(57) ABSTRACT

An optical material is provided. The optical material includes a nanoparticle-resin composite material in which metal oxide nanoparticles are dispersed in a polymer, wherein the metal oxide nanoparticles are crystalline and have a particle diameter of $1 \times 10^{-8}$ m or less, wherein surfaces of the metal oxide nanoparticles are coated with a surfactant, and wherein the metal oxide nanoparticles are crystallized at a temperature greater than or equal to 200° C. and less than or equal to 400° C. A light assembly including the nanoparticle-resin composite material is also provided.

12 Claims, 5 Drawing Sheets

FOREIGN PATENT DOCUMENTS

| | | |
|---|---|---|
| JP | 02-243555 | 9/1990 |
| JP | 2004-018311 | 1/2004 |
| JP | 2004-361924 | 12/2004 |
| JP | 2005-75723 | 3/2005 |
| JP | 2005099675 | 4/2005 |
| JP | 02-253837 | 9/2009 |
| JP | 64-003002 | 9/2009 |
| WO | 2004108116 | 12/2004 |
| WO | 2005013337 | 2/2005 |
| WO | 2005067524 | 7/2005 |

* cited by examiner

METAL OXIDE NANOPARTICLES, PRODUCTION METHOD THEREOF, LIGHT-EMITTING ELEMENT ASSEMBLY, AND OPTICAL MATERIAL

CROSS REFERENCES TO RELATED APPLICATIONS

The present application claims priority to Japanese Patent Application JP 2005-275141 filed in the Japanese Patent Office on Sep. 22, 2005, Japanese Patent Application JP 2006-001090 filed in the Japanese Patent Office on Jan. 6, 2006, and Japanese Patent Application JP 2006-131670 filed in the Japanese Patent Office on May 10, 2006, the entire contents of which are incorporated herein by reference.

BACKGROUND

The present application relates to metal oxide nanoparticles, a production method thereof, and a light-emitting element assembly and an optical material that include the metal oxide nanoparticles.

In nanoparticle-resin composite materials prepared by adding metal oxide nanoparticles such as nanoparticles of zirconium oxide, niobium pentoxide, indium oxide, tin oxide, cerium oxide, hafnium oxide, or tantalum pentoxide to a polymer, their refractive indices can be controlled to be higher than the refractive index $n_m$ of the polymer alone. Therefore, such metal oxide nanoparticles serving as an additive for a polymer are useful for designing and producing various optical materials. Examples of optical products in which an increase in refractive index is effective include optical lenses, light control films, Fresnel lenses, antireflective coatings, optical discs, diffusion films, and holographic substrates.

In the metal oxide nanoparticles used in such applications, it is important that the transparency and other optical properties of the nanoparticle-resin composite materials prepared by combining a polymer are not degraded. When the refractive index $n_p$ of the metal oxide nanoparticles and the refractive index $n_m$ of the polymer are different from each other, the transparency of the nanoparticle-resin composite material in which the optical path length is, for example, on the millimeter order markedly depends on the particle diameter of the metal oxide nanoparticles and the dispersibility of the metal oxide nanoparticles in the polymer. When the metal oxide nanoparticles have a large particle diameter, the transparency of the nanoparticle-resin composite material is decreased because the metal oxide nanoparticles scatter light. When the dispersibility of the metal oxide nanoparticles is not satisfactory, the transparency of the nanoparticle-resin composite material is markedly decreased because the metal oxide nanoparticles are agglomerated, and the agglomerated metal oxide nanoparticles strongly scatter or reflect light.

It is known that metal oxide nanoparticles, the surfaces of which are coated with a surfactant, can be synthesized by liquid-phase synthesis. The surfactant on the surfaces of the metal oxide nanoparticles stabilizes the dispersion state of the metal oxide nanoparticles in solvents and prevents agglomeration. Therefore, it is believed that such a surfactant is also effective in stabilizing the dispersion state in polymers (see, for example, Japanese Unexamined Patent Application Publication No. 2005-75723).

Regarding zirconium oxide nanoparticles, for example, a document written by F. C. M. Woudenberg, W. F. C. Sager, N. G. M. Sibelt, and H. Verweij; Adv. Mater. 2001, 13, 514 (referred to as Document 1) describes that amorphous zirconium oxide nanoparticles are usually formed. A method of synthesizing zirconium oxide nanoparticles the surfaces of which are coated with trioctylphosphine oxide and which have a particle diameter of 10 nm or less and excellent crystallinity is reported in a document written by J. Joo, T. Yu, Y. W. Kim, H. M. Park, F. Wu, J. Z. Zhang, and T. J. Hyeon; Am. Chem. Soc. 2003, 125, 6553 (referred to as Document 2). Furthermore, regarding niobium pentoxide nanoparticles, for example, a document written by P. Griesmar, G. Papin, C. Sanchez, and J. Livage; Chem. Mater. 1991, 3, 335 (referred to as Document 3) describes that amorphous niobium pentoxide nanoparticles are usually formed.

According to Document 1, the resulting zirconium oxide nanoparticles are amorphous. Here, from the viewpoint of increasing the refractive index, it is desired that nanoparticles be crystalline. Therefore, annealing to induce crystallization is necessary. However, in order to crystallize the zirconium oxide nanoparticles, annealing at a high temperature of 400° C. or higher is necessary. Consequently, for example, a surfactant is thermally decomposed and the particles are sintered, resulting in problems of degrading the dispersibility and fineness of the zirconium oxide nanoparticles. In the synthetic method disclosed in Document 2, since agglomerated particles that do not disperse are also produced at the same time, the yield of the zirconium oxide nanoparticles having excellent dispersibility is decreased, thus increasing the production cost. Furthermore, in the technique disclosed in Document 3, the niobium pentoxide nanoparticles are more difficult to crystallize than the zirconium oxide nanoparticles. In order to crystallize the niobium pentoxide nanoparticles, annealing at a high temperature of 550° C. or higher is necessary.

SUMMARY

It is desirable to provide metal oxide nanoparticles that have a particle diameter of $1\times10^{-8}$ m or less and excellent crystallinity, and that can be stably dispersed in an organic solvent, a liquid-phase synthesis method of producing the metal oxide nanoparticles with high productivity, and a light-emitting element assembly and an optical material that include the metal oxide nanoparticles.

A method of producing metal oxide nanoparticles according to a first embodiment includes the steps of (A) mixing a metal alkoxide, a surfactant, and a first organic solvent under an inert atmosphere to prepare a reaction solution, (B) mixing a reaction initiator prepared by mixing a catalyst with a solvent and the reaction solution under an inert atmosphere and heating to produce an intermediate product, and (C) mixing the intermediate product with a second organic solvent followed by heating the mixture of the intermediate product and the second organic solvent under an inert atmosphere to prepare metal oxide nanoparticles, the surfaces of which are coated with the surfactant.

A method of producing metal oxide nanoparticles according to a second embodiment includes the steps of (A) mixing a metal alkoxide, a surfactant, a first organic solvent, and core particles composed of an oxide of a metal different from the metal constituting the metal alkoxide under an inert atmosphere to prepare a reaction solution, (B) mixing a reaction initiator prepared by mixing a catalyst with a solvent and the reaction solution under an inert atmosphere and heating to produce an intermediate product coating the surfaces of the core particles, and (C) mixing the core particles, the surfaces of which are coated with the intermediate product, with a second organic solvent followed by heating the mixture of the core particles and the second organic solvent under an inert atmosphere to prepare metal oxide nanoparticles wherein the surfaces of the core particles are coated with a shell layer composed of an oxide of the metal constituting the metal alkoxide, and the surface of the shell layer is coated with the surfactant.

Alkoxy groups may remain in the intermediate product at the time of the completion of step (B). However, in order to smoothly conduct crystallization of the intermediate product in step (C), the amount of residual alkoxy group is preferably small. Therefore, in order to reduce the amount of alkoxy groups remaining in the intermediate product, in the method of producing metal oxide nanoparticles according to the first embodiment or the second embodiment, an alcohol elimination process for the intermediate product is preferably performed between step (B) and step (C). Examples of the effective alcohol elimination process include a hydrothermal treatment in which the intermediate product is mixed with water in a pressure-resistant container (a surfactant such as sodium oleate may be further mixed), and the mixture was then heated at 120° C. or higher; and addition of an oxidizing agent composed of nitric acid, hydrogen peroxide, and an amine oxide.

In the method of producing metal oxide nanoparticles according to the first embodiment or the second embodiment including the above preferred embodiment, the step of separating and washing the prepared metal oxide nanoparticles may be performed after step (C).

In the method of producing metal oxide nanoparticles according to the first embodiment or the second embodiment including the above preferred embodiments, the heating of the mixture of the intermediate product and the second organic solvent or the mixture of core particles and the second organic solvent in step (C) is preferably performed at a temperature of 200° C. or higher. More specifically, in step (C), the separated and washed intermediate product or the core particles, the surfaces of which are coated with the intermediate product, are mixed with the second organic solvent; the intermediate product is dissolved in the second organic solvent; and the mixture of the intermediate product and the second organic solvent (the solution in which the intermediate product is dissolved in the second organic solvent) is heated under an inert atmosphere under stirring at a temperature of 200° C. or higher, preferably at a temperature of 220° C. or higher, and more preferably at a temperature of 250° C. or higher. Such a heat treatment may be referred to as liquid-phase annealing.

In the method of producing metal oxide nanoparticles according to the first embodiment including the above preferred embodiments, the metal constituting the metal alkoxide may be at least one metal, such as, zirconium, niobium, indium, tin, cerium, hafnium, and tantalum. On the other hand, in the method of producing metal oxide nanoparticles according to the second embodiment including the above preferred embodiments, the metal constituting the metal alkoxide may be at least one metal, such as, zirconium, niobium, indium, tin, cerium, hafnium, and tantalum, and the metal constituting the core particles may be at least one metal selected, such as, titanium, zirconium, niobium, indium, tin, cerium, hafnium, and tantalum.

A method of producing metal oxide nanoparticles according to a third embodiment includes the steps of performing hydrolysis and condensation by dehydration of a metal alkoxide in the presence of a surfactant to produce an intermediate product, the surface of which is modified with the surfactant, and heating the intermediate product in a liquid phase while the state in which the surface is modified with the surfactant is maintained, thereby producing metal oxide nanoparticles, the surfaces of which are coated with the surfactant.

A method of producing metal oxide nanoparticles according to a fourth embodiment includes the steps of performing hydrolysis and condensation by dehydration of a metal alkoxide in the presence of core particles composed of an oxide of a metal different from the metal constituting the metal alkoxide and a surfactant to produce an intermediate product coating the core particles, the surface of the intermediate product being modified with the surfactant, and heating the intermediate product in a liquid phase while the state in which the surface is modified with the surfactant is maintained, thereby producing metal oxide nanoparticles each including a shell layer composed of a metal oxide, the surface of the shell layer being coated with the surfactant, and a core particle coated with the shell layer.

Metal oxide nanoparticles according to a first embodiment are composed of an oxide of a metal, such as, zirconium, niobium, indium, tin, cerium, hafnium, and tantalum, wherein the metal oxide nanoparticles are crystalline and have a particle diameter of $1 \times 10^{-8}$ m or less, and the surfaces of the metal oxide nanoparticles are coated with a surfactant.

Metal oxide nanoparticles according to a second embodiment include core particles composed of an oxide of a metal selected, such as, titanium, zirconium, niobium, indium, tin, cerium, hafnium, and tantalum, and a crystalline shell layer that is composed of an oxide of a metal selected, such as, zirconium, niobium, indium, tin, cerium, hafnium, and tantalum, and that is composed of an oxide of a metal different from the metal constituting the core particles, and that coats the core particles, wherein the particle diameter is $1 \times 10^{-8}$ m or less, and the surface of the shell layer is coated with a surfactant.

Metal oxide nanoparticles according to a third embodiment are produced by the steps of (A) mixing a metal alkoxide, a surfactant, and a first organic solvent under an inert atmosphere to prepare a reaction solution, (B) mixing a reaction initiator prepared by mixing a catalyst with a solvent and the reaction solution under an inert atmosphere and heating to produce an intermediate product, (C) mixing the intermediate product with a second organic solvent followed by heating the mixture of the intermediate product and the second organic solvent under an inert atmosphere to prepare metal oxide nanoparticles, and (D) separating and washing the prepared metal oxide nanoparticles, wherein the surfaces of the metal oxide nanoparticles are coated with the surfactant.

In the metal oxide nanoparticles according to the third embodiment, the metal oxide nanoparticles are preferably crystalline and the particle diameter is preferably $1 \times 10^{-8}$ m or less.

Metal oxide nanoparticles according to a fourth embodiment are produced by the steps of (A) mixing a metal alkoxide, a surfactant, a first organic solvent, and core particles composed of an oxide of a metal different from the metal constituting the metal alkoxide under an inert atmosphere to prepare a reaction solution, (B) mixing a reaction initiator prepared by mixing a catalyst with a solvent and the reaction solution under an inert atmosphere and heating to produce an intermediate product coating the surfaces of the core particles, (C) mixing the core particles, the surfaces of which are coated with the intermediate product, with a second organic solvent followed by heating the mixture of the core particles and the second organic solvent under an inert atmosphere to prepare metal oxide nanoparticles wherein the surfaces of the core particles are coated with a shell layer composed of an oxide of the metal constituting the metal alkoxide, and (D)

separating and washing the prepared metal oxide nanoparticles, wherein the surface of the shell layer is coated with the surfactant.

In the metal oxide nanoparticles according to the fourth embodiment, the shell layer is preferably crystalline and the particle diameter of the metal oxide nanoparticles is preferably $1 \times 10^{-8}$ m or less.

A light-emitting element assembly according to a first embodiment includes (a) a light-emitting element, (b) a sealing member that seals the light-emitting element, and (c) a filling material filled in a space disposed between the light-emitting element and the sealing member, wherein the filling material is composed of a nanoparticle-resin composite material in which the metal oxide nanoparticles according to any one of the first embodiment to the fourth embodiment that includes the above-described preferred embodiments and the structures are dispersed in a polymer.

A light-emitting element assembly according to a second embodiment includes (a) a light-emitting element, and (b) a sealing member that seals the light-emitting element, wherein the sealing member is composed of a nanoparticle-resin composite material in which the metal oxide nanoparticles according to any one of the first embodiment to the fourth embodiment that include the above-described preferred embodiments and the structures are dispersed in a polymer.

An optical material according to an embodiment is composed of a nanoparticle-resin composite material in which the metal oxide nanoparticles according to any one of the first embodiment to the fourth embodiment that include the above-described preferred embodiments and structures are dispersed in a polymer.

In the methods of producing metal oxide nanoparticles according to the first to fourth embodiments, the metal oxide nanoparticles according to the first to fourth embodiments, the light-emitting element assemblies according to the first and second embodiment, and an optical material according to an embodiment that include the above-described preferred embodiments and structures (hereinafter, these may be collectively simply referred to as embodiments), an amorphous intermediate product is crystallized by heating (liquid-phase annealing) to produce crystalline metal oxide nanoparticles or a shell layer. The higher the temperature at which liquid-phase annealing is performed (referred to as annealing temperature), the shorter the time required for crystallization. However, it is important that the annealing temperature is lower than the temperature at which the surfactant thermally decomposes. When the annealing temperature is higher than the temperature at which the surfactant thermally decomposes, the dispersibility of the metal oxide nanoparticles may be impaired. When the annealing temperature is lower than 200° C., crystallization of the intermediate product may not satisfactorily proceed. In step (C), 24 hours is sufficient for the liquid-phase annealing (the time required for crystallizing the intermediate product). After step (C), that is, after the completion of the liquid-phase annealing, the solution is cooled to about room temperature.

The intermediate product or core particles and the second organic solvent may be mixed by stirring with, for example, a magnetic stirrer or a mechanical stirrer. Heating (liquid-phase annealing) of the mixture of the intermediate product or the core particles and the second organic solvent (the product in which the intermediate product is dissolved in the second organic solvent) may be performed with, for example, a mantle heater. Examples of the inert atmosphere during heating include a nitrogen gas atmosphere and an argon gas atmosphere. The heat treatment (liquid-phase annealing) may be performed in a state that is separated from air, for example, with an autoclave filled with an inert gas such as nitrogen gas.

The second organic solvent preferably has a boiling point of 200° C. or higher and can dissolve the intermediate product. The second organic solvent is preferably at least one solvent selected from, for example, heptadecane, octadecane, dioctyl ether, diphenyl ether, trioctylphosphine oxide, 1-octadecene, dibenzyl ether, benzophenone, oleic acid, octadecanoic acid (stearic acid), 1-adamantanecarboxylic acid, oleylamine, and stearylamine. The surfactant and the second organic solvent may be the same substance. Oleic acid, stearic acid, 1-adamantanecarboxylic acid, oleylamine, stearylamine, or trioctylphosphine oxide also functions as the surfactant.

According to an embodiment, the surface of the intermediate product is modified with the surfactant, and the intermediate product may be in a form that can be dissolved in the second organic solvent. For example, the surfactant may modify the surface of the intermediate product in the form of chemical adsorption or physical adsorption. The phrase "the intermediate product can be dissolved in the second organic solvent" means that the intermediate product is stably dispersed in the second organic solvent, and no aggregation or precipitation is generated when the mixture is left to stand. In the intermediate product, although an inorganic network of M-O-M (wherein M represents a metal atom) is produced, the intermediate product is in an amorphous state or in a state in which crystallization is not satisfactorily performed. In addition, an alkoxy group or a hydroxyl group may still remain in the intermediate product. By obtaining such an intermediate product, in the subsequent step (C), crystallization and acceleration of crystallization of the metal oxide nanoparticles or the shell layer can be performed on the basis of heating (liquid-phase annealing) at a low temperature of, for example, 450° C. or lower.

In the above-described preferred embodiments, the metal (M) constituting the metal alkoxide is preferably at least one metal, such as, zirconium (Zr), niobium (Nb), indium (In), tin (Sn), cerium (Ce), hafnium (Hf), and tantalum (Ta). Ultimately, zirconium oxide ($ZrO_2$) nanoparticles, niobium pentoxide ($Nb_2O_5$) nanoparticles, indium oxide ($In_2O_3$) nanoparticles, tin oxide ($SnO_2$) nanoparticles, cerium oxide ($CeO_2$) nanoparticles, hafnium oxide ($HfO_2$) nanoparticles, and or tantalum pentoxide ($Ta_2O_5$) nanoparticles can be obtained as metal oxide nanoparticles from the above metal alkoxides. The metal oxide nanoparticles may be composed of one type of these substances or may be composed of a mixture of two or more substances.

In the above-described preferred embodiments, the metal alkoxide preferably includes at least one type of alkoxy group containing a linear or branched alkyl chain having 1 to 18 carbon atoms. The particle diameter of the metal oxide nanoparticles can be controlled by appropriately selecting the type of the alkoxy group. Examples of the alkoxy group include a methoxy group, an ethoxy group, a n-propoxy group, an isopropoxy group, a n-butoxy group, an isobutoxy group, a sec-butoxy group, a tert-butoxy group, a n-pentyloxy group, a n-hexyloxy group, a n-heptyloxy group, a n-octyloxy group, an isooctyloxy group, a 2-ethylhexyloxy group, a n-nonyloxy group, a n-decyloxy group, a n-undecyloxy group, a n-dodecyloxy group, a n-tetradecyloxy group, a n-hexadecyloxy group, and a n-octadecyloxy group.

Furthermore, in the above-described preferred embodiments, the first organic solvent preferably includes a linear or branched alkyl chain having 7 to 18 carbon atoms or an aryl group, has compatibility with the metal alkoxide and the surfactant, and is nonreactive to the metal alkoxide and the surfactant. Examples of the organic solvent include n-heptane, n-octane, isooctane, n-nonane, n-decane, n-dodecane, n-hexadecane, n-heptadecane, n-octadecane, 1-octadecene, toluene, dioctyl ether, and diphenyl ether. The phrase "the first organic solvent has compatibility with the metal alkoxide" or "the first organic solvent has compatibility with the surfactant" means that these are homogeneously mixed without phase separation. The phrase "the first organic solvent is nonreactive to the metal alkoxide" means that the first organic solvent neither decomposes the metal alkoxide nor causes denaturation such as chemical modification. The phrase "the first organic solvent is nonreactive to the surfactant" means that the first organic solvent neither decomposes the surfactant nor causes denaturation such as chemical modification.

The first organic solvent may have the requirements of the second organic solvent in advance. That is, for example, an organic solvent having a boiling point of 200° C. or higher may be selected as the first organic solvent. Furthermore, a catalyst having a boiling point of 200° C. or higher may be selected as the catalyst and the solvent constituting the reaction initiator (i.e., solvent to be mixed with the catalyst) may be an alcohol having a boiling point of 200° C. or higher. In this case, the operations of separation and washing of the intermediate product need not be performed after the completion of step (B). Thus, step (C) can be performed using the mixed solution obtained after step (B) without further treatment.

Furthermore, in the above-described preferred embodiments, the surfactant (also referred to as a dispersant) is a compound selected, such as, carboxylic acids, phosphinic acids, phosphonic acids, sulfinic acids, sulfonic acids, thiols, and amines. In addition, the selected compound may include a linear or branched alkyl chain having 6 to 30 carbon atoms, an aryl group, an aryloxy group, or an olefin chain. The olefin chain represents a hydrocarbon group containing at least one double bond. The alkoxy group of the metal alkoxide is modified with the surfactant in the reaction solution. In step (B), the metal alkoxide is hydrolyzed and condensed by dehydration at an optimum rate in the presence of the first organic solvent and a surfactant, the alkoxy group of the metal alkoxide is modified with the surfactant to produce an intermediate product that can be dissolved in the first organic solvent. The hydrolyzability of the alkoxy group can be controlled by appropriately selecting the surfactant, and the reaction time in step (B) can be reduced. Furthermore, the growth process of the intermediate product can be controlled, and the particle diameter of the final metal oxide nanoparticles can be reduced. Specific examples of the surfactant include hexanoic acid, octanoic acid, decanoic acid, dodecanoic acid, hexadecanoic acid, octadecanoic acid (stearic acid), oleic acid, linoleic acid, benzoic acid, acetylbenzoic acid, diphenyl-4-benzoic acid, phenylacetic acid, diphenylacetic acid, methylbenzoic acid, butylbenzoic acid, phenoxyacetic acid, phenoxybenzoic acid, phenylbutyric acid, diphenylphosphinic acid, phenylphosphonic acid, benzenesulfonic acid, dodecylbenzenesulfonic acid, decanethiol, dodecanethiol, and octadecanethiol. These organic compounds may be used in combinations of two or more compounds in any mixing ratio according to the polymer used. Among the above surfactants, carboxylic acids, phosphinic acid, phosphonic acid, sulfinic acids, and sulfonic acids form ionic bonds with the surfaces of the metal oxide nanoparticles or the surface of the shell layer, and thiols form covalent bonds with the surfaces of the metal oxide nanoparticles or the surface of the shell layer. Alternatively, an organic compound having a functional group that forms covalent bonds or ionic bonds with the surfaces of the metal oxide nanoparticles or the surface of the shell layer or a functional group that forms coordinate bonds or hydrogen bonds with the surfaces of the metal oxide nanoparticles or the surface of the shell layer, having an organic group exhibiting an affinity with a polymer, and having a molecular weight of $1 \times 10^3$ or less is preferably selected as the surfactant. When the molecular weight of the surfactant exceeds $1 \times 10^3$, since the ratio of the organic substance including the polymer is relatively increased, the volume filling rate of the metal oxide nanoparticles in the nanoparticle-resin composite material is not satisfactorily increased. As a result, the refractive index of the nanoparticle-resin composite material may not be controlled to a desired value. Here, the molecular weight of the surfactant represents a molecular weight of a relative value in terms of polystyrene measured by gel permeation chromatography (GPC).

A surfactant may be added to the second organic solvent in which the intermediate product is dissolved. When, for example, an amine or an amine oxide with a boiling point of 200° C. or higher is used as the surfactant, crystallization of the intermediate product can be further accelerated (that is, the time required for liquid-phase annealing can be decreased and the annealing temperature can be decreased). When, for example, cetyltrimethylammonium chloride, cetyltrimethylammonium bromide, didodecyldimethylammonium bromide, or the like is used as the surfactant, the crystal growth of the metal oxide nanoparticles or the shell layer can be controlled.

In the above-described preferred embodiments, the catalyst may be a base catalyst composed of an amine or an amine oxide containing a linear or branched alkyl chain having 1 to 18 carbon atoms or at least one type of acid catalyst selected, such as, hydrochloric acid, nitric acid, sulfuric acid, acetic acid, oxalic acid, and phosphoric acid. The molar ratio of [catalyst/metal alkoxide] is preferably $1 \times 10^2$ or less, more preferably in the range of $1 \times 10^{-1}$ to $5 \times 10^1$, and particularly preferably in the range of $1 \times 10^0$ to $1 \times 10^1$. An example of the solvent constituting the reaction initiator (solvent to be mixed with the catalyst) is water. An alcohol may also be used instead of water. That is, it is important that the solvent constituting the reaction initiator has a hydroxyl group. Preferred examples of the alcohol include ethylene glycol, propylene glycol, triethylene glycol, tetraethylene glycol, polyethylene glycol, and polypropylene glycol. The molar ratio of [solvent constituting reaction initiator/metal alkoxide] is preferably in the range of $5 \times 10^0$ to $5 \times 10^2$, more preferably in the range of $1 \times 10^1$ to $3 \times 10^2$, and particularly preferably in the range of $2 \times 10^1$ to $1 \times 10^2$. When the molar ratio of [solvent constituting reaction initiator/metal alkoxide] is out of the range of $5 \times 10^0$ to $5 \times 10^2$, the yield may be decreased, resulting in a decrease in productivity.

The value of [number of moles of metal alkoxide/volume of organic solvent (unit: liter)] in the reaction solution is preferably in the range of $1 \times 10^{-3}$ to $1 \times 10^2$ mole/liter, more preferably in the range of $5 \times 10^{-3}$ to $5 \times 10^1$ mole/liter, and particularly preferably in the range of $1 \times 10^{-2}$ to $1 \times 10^1$ mole/liter. As the value of [number of moles of metal alkoxide/volume of organic solvent (unit: liter)] increases, the reaction time can be decreased. However, when the value exceeds $1 \times 10^2$ mole/liter, the intermediate product may not be dissolved in the first organic solvent, the particle diameter of the final metal oxide nanoparticles may exceed $1 \times 10^{-8}$ m, or the dispersibility may be degraded. On the other hand, when the value is less than $1 \times 10^{-3}$ mole/liter, the yield may be decreased, thus decreasing productivity.

The molar ratio of [metal alkoxide/surfactant] in the reaction solution is preferably in the range of $1 \times 10^{-2}$ to $1 \times 10^2$, more preferably in the range of $5 \times 10^{-2}$ to $5 \times 10^1$, and particularly preferably in the range of $1\times10^{-1}$ to $1\times10^{1}$. When the molar ratio of [metal alkoxide/surfactant] in the reaction solution is out of this range, the intermediate product may not be dissolved in the first organic solvent, the particle diameter of the final metal oxide nanoparticles may exceed $1\times10^{-8}$ m, or the dispersibility may be degraded.

In the above-described preferred embodiments, in step (A), a complexing agent may be mixed to prepare the reaction solution. In this case, the complexing agent may be a β-diketone. Examples of the β-diketone include acetylacetone, ethyl acetoacetate, and benzoylacetone. The complexing agent modifies the alkoxy group of the metal alkoxide. Thereby, the particle diameter of the metal oxide nanoparticles can be controlled, and the value of the aspect ratio of the metal oxide nanoparticles represented by [length of major axis/length of minor axis] can be increased compared with the case where a complexing agent is not used. The molar ratio of [metal alkoxide/complexing agent] is preferably 0.2 or more, more preferably in the range of 0.2 to 100, and most preferably in the range of 0.2 to 10. When the molar ratio of [metal alkoxide/complexing agent] is less than 0.2, the modified alkoxy group of the metal alkoxide is not satisfactorily reacted, resulting in a decrease in the yield and a decrease in productivity.

In process (A), at least the metal alkoxide, the surfactant, and the first organic solvent are mixed to prepare a homogeneous reaction solution. When a homogeneous reaction solution is not easily prepared, the reaction solution may be heated. The mixture of the surfactant and the first organic solvent is preferably used after deaeration (for example, after deaeration by freeze-drying or after deaeration by heat-drying under a reduced pressure). Thereby, hydrolysis and condensation by dehydration of the metal alkoxide in the reaction solution can be prevented. A specific example of the method of mixing in step (A) is stirring with a magnetic stirrer or a mechanical stirrer at a temperature in the range of 10° C. to 200° C. and preferably in the range of 20° C. to 120° C. Examples of the inert atmosphere in step (A) include a nitrogen gas atmosphere and an argon gas atmosphere.

In step (B), after the reaction solution and the reaction initiator are mixed, the mixed solution is heated under stirring. The stirring can be performed with, for example, a magnetic stirrer or a mechanical stirrer. The heating may be performed with, for example, an oil bath or a mantle heater. Thereby, the metal alkoxide is hydrolyzed and condensed by dehydration at an optimum rate to produce the intermediate product. The heating temperature (reaction temperature) is preferably in the range of 50° C. to 200° C. and more preferably in the range of 70° C. to 120° C. When the heating temperature is lower than 50° C., the alkoxy group of the metal alkoxide is not satisfactorily reacted, resulting in a decrease in the yield and a decrease in productivity. The reaction time (the time required for producing the intermediate product) in step (B) depends on the type of the surfactant used and the concentrations of the starting materials, but the reaction time is about several tens of minutes to 24 hours. At the time of completion of step (B), the heating temperature may be lower than 50° C. Examples of the inert atmosphere in step (B) include a nitrogen gas atmosphere and an argon gas atmosphere. The surface of the resulting intermediate product is modified with the surfactant, and the intermediate product is soluble in nonpolar solvents such as toluene and hexane.

After the completion of step (B) and before the initiation of step (C), the intermediate product is preferably separated and washed. This separation and washing can be performed as follows. Since the intermediate product is stable in air, the operations of separation and washing may be performed in air. Specifically, after the completion of step (B), a polar solvent (e.g., ethanol) is added to the mixed solution. In this step, when phase separation of the solution occurs, preferably, an appropriate amount of a nonpolar solvent (e.g., toluene) is further added. Alternatively, water in the solution is removed, and a polar solvent may then be added. Alternatively, in order to reduce the time required for the separation, the solution may be concentrated in advance, and a polar solvent may then be added. Thus, the resulting intermediate product can be precipitated without causing a permanent agglomeration. Subsequently, the precipitated intermediate product may be separated by centrifugal separation, suction filtration, or the like. The separated intermediate product may then be washed with a polar solvent (e.g., ethanol) a plurality of times. Alternatively, in a washing method, steps of dissolving the separated intermediate product in a nonpolar solvent (e.g., toluene), adding a polar solvent (e.g., ethanol) to the solution, and again separating the intermediate product by centrifugal separation, suction filtration, or the like may be repeated a plurality of times. After the intermediate product is separated and washed, an alcohol elimination process is preferably performed.

When a step of separating and washing the resulting metal oxide nanoparticles [step (D)] is performed after the completion of step (C), a polar solvent (e.g., ethanol) is added to the solution obtained at the completion of step (C). In order to reduce the time required for the separation, the solution may be concentrated in advance, and the polar solvent may then be added. Thereby, the resulting metal oxide nanoparticles can be precipitated without causing a permanent agglomeration. Subsequently, the precipitated metal oxide nanoparticles may be separated by centrifugal separation, suction filtration, or the like. Furthermore, the separated metal oxide nanoparticles may then be washed with a polar solvent (e.g., ethanol) a plurality of times. Alternatively, in a washing method, steps of dissolving the separated metal oxide nanoparticles in a nonpolar solvent (e.g., toluene), adding a polar solvent (e.g., ethanol) to the solution, and again separating the metal oxide nanoparticles by centrifugal separation, suction filtration, or the like may be repeated a plurality of times. In addition, in the step of washing, a size-selective precipitation (precipitation for classification) may be performed.

The metal oxide nanoparticles produced by the above steps have a particle diameter of $1\times10^{-8}$ m (preferably 10 nm) or less and excellent crystallinity, the surfaces of which are coated with the surfactant, and are stably dispersed in a nonpolar solvent (e.g., toluene) serving as an organic solvent for dispersion. That is, preferably, the diameter of all the particles is 10 nm or less, and crystalline metal oxide nanoparticles are in a dispersion state (i.e., form a group of metal oxide nanoparticles) without being agglomerated. The prepared metal oxide nanoparticles can be stably dispersed in a polymer having affinity with the surfactant to the extent of about 40% of volume filling rate. As described above, by combining the polymer, a nanoparticle-resin composite material that has a high refractive index (for example, 1.55 or more) and that is transparent in the visible light region can be produced.

The core particles can be fundamentally composed of metal oxide nanoparticles according the first embodiment or the third embodiment, and can be produced on the basis of the method of producing metal oxide nanoparticles according the first embodiment or the third embodiment.

In the present application, the phrase "metal oxide nanoparticles or a shell layer is crystalline" means that a lattice plane can be observed when the metal oxide nanoparticles are observed with a high-resolution electron microscope.

In the present application, the particle diameter (D) of metal oxide nanoparticles is preferably $1\times10^{-8}$ m or less, more preferably in the range of $2\times10^{-9}$ m to $1\times10^{-8}$ m, and further preferably in the range of $2\times10^{-9}$ m to $1.0\times10^{-8}$ m. The particle diameter of a metal oxide nanoparticle can be determined by measuring the particle diameter of the metal oxide nanoparticle observed with a transmission electron microscope (TEM). When the shape (planar shape) of a metal oxide nanoparticle observed with a transmission electron microscope is not a round shape, a circle having the same area as that of the observed metal oxide nanoparticle is assumed, and the diameter of the circle may be defined as the particle diameter. Examples of the shape (three-dimensional shape) of a particle in the case where the three-dimensional shape of a metal oxide nanoparticle is not spherical include a rod shape, a spheroid, and a rectangular parallelepiped. The particle diameter of metal oxide nanoparticles in a nanoparticle-resin composite material can be determined by, for example, preparing a thin section with a microtome, and observing the thin section with a transmission electron microscope. The phrase "the upper limit of the particle diameter (D) of the metal oxide nanoparticles is $1\times10^{-8}$ m and preferably $1.0\times10^{-8}$ m" as described above means that the relationship represented by $D_{ave}+2\sigma \leq 1\times10^{-8}$ m or $D_{ave}+2\sigma 1.0\times10^{-8}$ m is satisfied wherein $D_{ave}$ represents the average particle diameter of the metal oxide nanoparticles and $\sigma$ represents the standard deviation. By specifying the particle diameter (D) of the metal oxide nanoparticles to $1\times10^{-8}$ m or less, a decrease in light transmittance of the nanoparticle-resin composite material and a loss of light that are caused by Rayleigh scattering can be suppressed. Thus, a nanoparticle-resin composite material that is transparent in the visible light region can be produced in view of practical use. The light transmittance exponentially decreases as the optical path length increases. Therefore, as described below, as the optical path length increases, metal oxide nanoparticles having a smaller diameter are preferably used. When agglomerates of metal oxide nanoparticles are formed in a nanoparticle-resin composite material, the size of the agglomerates acts as the effective particle diameter. Therefore, in order to suppress Rayleigh scattering, it is important that the metal oxide nanoparticles are filled in a state in which the metal oxide nanoparticles are dispersed so as not to form agglomerates.

Examples of a light-emitting element in the light-emitting element assembly according to an embodiment include a light-emitting diode (LED) and a semiconductor laser. When the light-emitting element is a light-emitting diode, examples of the light-emitting diode include a red-light-emitting diode that emits red light (for example, having a wavelength of 640 nm), a green-light-emitting diode that emits green light (for example, having a wavelength of 530 nm), a blue-light-emitting diode that emits blue light (for example, having a wavelength of 450 nm), and a white-light-emitting diode (a light-emitting diode that emits white light by combining, for example, an ultraviolet or blue light-emitting diode and phosphor particles). The light-emitting diode may have a face-up structure or a flip-chip structure. That is, the light-emitting diode may include a substrate and a luminescent layer provided on the substrate. The light-emitting diode may have a structure in which light is emitted from the luminescent layer to the outside or a structure in which light emitted from the luminescent layer is emitted to the outside through the substrate. More specifically, for example, a light-emitting diode (LED) has a laminated structure including a first cladding layer that is provided on the substrate and that is composed of a compound semiconductor layer having a first conductivity type (for example, n type), an active layer provided on the first cladding layer, and a second cladding layer that is provided on the active layer and that is composed of a compound semiconductor layer having a second conductivity type (for example, p type). The light-emitting diode further includes a first electrode that is electrically connected to the first cladding layer and a second electrode that is electrically connected to the second cladding layer. The materials of the layers constituting the light-emitting diode may be selected from known compound semiconductor materials according to the emission wavelength. In the light-emitting element assembly according to an embodiment, light emitted from the light-emitting element is transmitted through a filling material composed of a nanoparticle-resin composite material and a sealing member and emitted to the outside, or light emitted from the light-emitting element is transmitted through a sealing member composed of a nanoparticle-resin composite material and emitted to the outside.

In the light-emitting element assembly according to the first embodiment, from the standpoint that light reflection on the interface with the filling material is suppressed, the sealing member is preferably composed of a material having a high refractive index. Examples of the material having a high refractive index include plastic materials having a high refractive index such as Prestige (trade name, refractive index: 1.74) produced by Seiko Optical Products Co., Ltd., ULTIMAX V AS 1.74 (trade name, refractive index: 1.74) produced by Showa Optical Co., Ltd., and NL5-AS (trade name, refractive index: 1.74) produced by Nikon-Essilor Co., Ltd.; optical glasses such as glass members NBFD11 (refractive index n: 1.78), M-NBFD82 (refractive index n: 1.81), and M-LAF81 (refractive index n: 1.731) that are produced by HOYA Corporation; and inorganic dielectric materials such as $KTiOPO_4$ (refractive index n: 1.78) and lithium niobate [$LiNbO_3$] (refractive index n: 2.23).

Alternatively, in the light-emitting element assembly according to the first embodiment, specific examples of the material constituting the sealing member include epoxy resins, silicone resins, acrylic resins, polycarbonate resins, spiro-compounds, polymethylmethacrylate, and copolymers thereof; diethylene glycol bis(allyl carbonate) (CR-39) and polymers of an urethane-modified monomer of mono(meth)acrylate of brominated bisphenol-A and copolymers thereof; polyester resins (e.g., polyethylene terephthalate resins and polyethylene naphthalate resins), unsaturated polyesters, acrylonitrile-styrene copolymers, vinyl chloride resins, polyurethane resins, and polyolefin resins. The sealing member may be composed of at least one of these materials. Considering heat resistance, aramid resins can also be used. In this case, the upper limit of the heating temperature during formation of an antifouling layer composed of a fluorocarbon resin, which is described below, is 200° C. or higher, and thus the range of fluorocarbon resins that can be used as the antifouling layer can be increased.

The light-emitting element assembly according to the first embodiment or the second embodiment can be used in devices that involve light emission. Examples of such devices include backlights [which include a planar light source device wherein two types of device including a direct-type backlight device and an edge-lighting-type backlight device (also referred to as side-lighting-type backlight device) are known] of liquid crystal display devices; lighting devices and lamps in vehicles such as automobiles, electric trains, ships and vessels, and aircrafts (e.g., headlights, taillights, high-mount stop lights, small lights, turn signal lamps, fog lights, interior lights, lights for meter panels, light sources installed in various buttons, lights for destination screens, emergency lights, and emergency exit guide lamps); various lighting devices and lamps in buildings (e.g., outdoor lights, interior lights, lighting equipment, emergency lights, and emergency exit guide lamps); street lights; various display lighting devices in traffic signals, signboards, machines, and apparatuses; and lighting equipment and light collection parts in tunnels, underground passages, and the like.

Examples of optical products to which the optical material according to an embodiment can be applied include not only the above-described light-emitting element assembly but also porous oxide electrodes in photoelectric transducers, lens materials for optical lenses, Fresnel lenses, microlens arrays, and the like; and various optical thin-films such as light control films, antireflective coatings, and diffusion films. The optical material according to an embodiment can also be applied to a photocatalyst. For example, the nanoparticle-resin composite material including metal oxide nanoparticles according to an embodiment composed of niobium pentoxide and a polymer has an excellent environmental resistance in which a degradation of optical properties (such as transparency) caused by heat or light is suppressed. Furthermore, in this nanoparticle-resin composite material, an effect of suppressing a change in refractive index for temperature variations can be provided as an athermal property. Therefore, this nanoparticle-resin composite material can be used as a microlens array, a filling material and a sealing member of optical semiconductor devices such as light-emitting diodes, and a material for optical fibers, optical adhesive, and various optical thin-films.

The filling material in the light-emitting element assembly according to the first embodiment, the sealing member in the light-emitting element assembly according to the second embodiment, and the optical material according to an embodiment are composed of a nanoparticle-resin composite material in which metal oxide nanoparticles according to an embodiment that include the above-described various preferred embodiments and structures are dispersed in a polymer. The refractive index of the nanoparticle-resin composite material can be adjusted on the basis of the following principle. Specifically, the refractive index of a nanoparticle-resin composite material prepared by dispersing metal oxide nanoparticles with a high refractive index in a matrix (polymer) is theoretically described by Maxwell Garnet (see C. F. Bohren and D. R. Huffman, "Adsorption and Scattering of Light by Small Particles", John Wiley & Sons, New York, 1983, p. 213). When the metal oxide nanoparticles are homogeneously dispersed in the polymer, the relative dielectric constant of the whole nanoparticle-resin composite material can be determined using equation (1):

$$\varepsilon_{av} = \varepsilon_m \left[ 1 + \frac{3\eta \left( \frac{\varepsilon_p - \varepsilon_m}{\varepsilon_p + 2\varepsilon_m} \right)}{1 - \eta \left( \frac{\varepsilon_p - \varepsilon_m}{\varepsilon_p + 2\varepsilon_m} \right)} \right] \quad (1)$$

$\varepsilon_{av}$: average relative dielectric constant (relative dielectric constant of whole nanoparticle-resin composite material)
$\varepsilon_p$: relative dielectric constant of spherical particles (metal oxide nanoparticles)
$\varepsilon_m$: relative dielectric constant of matrix (polymer)
$\eta$: volume filling rate of metal oxide nanoparticles Since refractive index n is represented by $n=\varepsilon^{1/2}$, the whole (average) refractive index of the nanoparticle-resin composite material can be determined using equation (1). For example, when metal oxide nanoparticles having a refractive index of 2.5 are dispersed in a polymer having a refractive index of 1.5 and the volume filling rates $\eta$ of the metal oxide nanoparticles are 0.06 and 0.15, the whole (average) refractive indices of the nanoparticle-resin composite material are 1.55 and 1.63, respectively. Accordingly, the refractive index of the whole nanoparticle-resin composite material can be adjusted by changing the volume filling rate $\eta$ of the metal oxide nanoparticles incorporated in the nanoparticle-resin composite material. Therefore, the material of the metal oxide nanoparticles may be selected in advance according to a target refractive index of the nanoparticle-resin composite material, and the volume filling rate $\eta$ may be further set. The volume filling rate $\eta$ of the metal oxide nanoparticles can be determined from the amount of residue (metal oxide nanoparticles) obtained after the nanoparticle-resin composite material is heated to burn out the organic component. The change in weight by heating can be measured by, for example, thermogravimetry (TG). The volume filling rate of the metal oxide nanoparticles in the final nanoparticle-resin composite material is preferably, for example, in the range of 0.01 to 0.4.

The light transmittance of a nanoparticle-resin composite material based on Rayleigh scattering in the case where particle diameter is sufficiently smaller than the wavelength of light can be determined using equations (2-1) and (2-2):

$$C_{sca} = \frac{8}{3} \left( \frac{2\pi n_m r}{\lambda} \right)^4 \cdot \left( \frac{\left(\frac{n_p}{n_m}\right)^2 - 1}{\left(\frac{n_p}{n_m}\right)^2 + 2} \right)^2 \cdot \pi r^2 \quad (2\text{-}1)$$

$$\alpha_{sca} = \frac{3}{4} \frac{\eta C_{sca}}{\pi r^3} \quad (2\text{-}2)$$

$C_{sca}$: scattering cross section (unit: nm$^2$)
$\alpha_{sca}$: quenching rate (unit: nm$^{-1}$)
$n_m$: refractive index of matrix (polymer)
$n_p$: refractive index of spherical particles (metal oxide nanoparticles)
r: radius ($=D_{ave}/2$) of spherical particles (metal oxide nanoparticles)
$\eta$: volume filling rate of metal oxide nanoparticles
$\lambda$: wavelength of light in air Accordingly, for example, when metal oxide nanoparticles having a refractive index of 2.5 are dispersed in a matrix (polymer) having a refractive index of 1.5 and the volume filling rate $\eta$ is 0.15, in order that the nanoparticle-resin composite material is transparent in a part with a thickness t of 0.5 mm through which light passes, the particle diameter D of the metal oxide nanoparticles is preferably 6 nm or less. When zirconium oxide nanoparticles having a refractive index of 2.2 are used as the metal oxide nanoparticles and dispersed in a matrix (polymer) having a refractive index of 1.5, and the volume filling rate $\eta$ is 0.15, in order that the nanoparticle-resin composite material is transparent in a part with a thickness t of 0.5 mm through which light passes, the particle diameter D of the metal oxide nanoparticles is preferably 8 nm or less. Thus, preferably, the particle diameter D and the volume filling rate $\eta$ of the metal oxide nanoparticles are appropriately selected so as to obtain a desired transparency according to the refractive index of the matrix (polymer) used and the refractive index of the metal oxide nanoparticles.

Examples of the polymer constituting the nanoparticle-resin composite material include epoxy resins, silicone resins, acrylic resins, polycarbonate resins, and spiro-compounds. In order to stabilize the dispersion of particles, an appropriate surfactant is preferably selected according to the polymer used. That is, an appropriate surfactant is preferably selected in producing the metal oxide nanoparticles, but in some cases, a surface treatment (as a substitute for an appropriate surfactant) may be performed after the production of the metal oxide nanoparticles.

Preferably, the nanoparticle-resin composite material is transparent in the visible light region and has a refractive index of 1.55 or more. The metal oxide nanoparticles preferably have a refractive index of 1.9 or more in the visible light region. More specifically, the refractive index of the metal oxide nanoparticles means the refractive index of the bulk of the material constituting the metal oxide nanoparticles. Refractive indices of various materials such as the refractive index of the metal oxide nanoparticles (more specifically, the refractive index of the bulk of the material constituting the metal oxide nanoparticles), the refractive index of the nanoparticle-resin composite material, and the refractive index of the polymer can be measured with an Abbe refractometer or a V-block refractometer. The term "visible light region" means the range of light having a wavelength in the range of 380 to 750 nm. The term "transparent" or the state in which "the metal oxide nanoparticles are not agglomerated in the polymer" or "the metal oxide nanoparticles are homogeneously dispersed in the polymer" means that the light transmittance measured at an optical path length of 0.5 mm and at a wavelength of 400 nm on the basis of a method of measuring a light transmittance described below is 80% or more.

In producing the nanoparticle-resin composite material, specifically, metal oxide nanoparticles coated with a surfactant can be mixed with a polymer by any one of the following two methods. Namely, in a first method, the metal oxide nanoparticles are dispersed in a solvent that also dissolves the polymer, the polymer is added and mixed under stirring, and only the organic solvent is removed by heating in a vacuum. In this case, the polymer is hardly vaporized because of its low vapor pressure. In a second method, a dry powder of the metal oxide nanoparticles is directly mixed with the polymer, and the mixture is homogeneously mixed with a known kneader.

In order to maintain heat resistance and light resistance, the nanoparticle-resin composite material may contain a known antioxidant or a light stabilizer.

In the light-emitting element assembly according to an embodiment, an antifouling layer composed of a fluorocarbon resin may be provided on the surface of the sealing member. The thickness of the antifouling layer is not particularly limited, but is preferably in the range of $5 \times 10^{-10}$ to $5 \times 10^{-8}$ m, and more preferably in the range of $1 \times 10^{-9}$ to $2 \times 10^{-8}$ m from the viewpoint of transparency.

The fluorocarbon resin constituting the antifouling layer fundamentally contains a perfluoropolyether group and preferably an alkoxy silano group. The molecular structure of the fluorocarbon resin is not primarily limited as long as the fluorocarbon resin has a perfluoropolyether group. However, in reality, there is a limitation based on the requirement for a certain degree of ease of synthesis, i.e., realizability. Specifically, examples of the fluorocarbon resin constituting the antifouling layer include perfluoropolyether-group-containing alkoxysilane compounds represented by general formula (A):

wherein $R_f$ represents a perfluoropolyether group, $R^1$ represents a divalent atom or group, $R^2$ represents an alkylene group or a phenylene group, $R^3$ represents an alkyl group, and j represents 1 or 2.

The molecular weight of the alkoxysilane compounds represented by general formula (A) is not particularly limited. However, in view of stability, ease of handling, and the like, the number-average molecular weight of the alkoxysilane compounds is in the range of $4 \times 10^2$ to $1 \times 10^4$ and preferably in the range of $5 \times 10^2$ to $4 \times 10^3$.

The perfluoropolyether group $R_f$ is a monovalent or divalent perfluoropolyether group. Specific structures of such perfluoropolyether groups are shown below, but are not limited thereto. In structural formulae (B), (C), (D), and (E), p and q are preferably in the range of 1 to 50 and each of n, l, m, and k represents an integer of 1 or more. The value m/l is preferably in the range of 0.5 to 2.0.

In j=2, an example of the perfluoropolyether group $R_f$ in general formula (A) is a group represented by structural formula (B):

 (B)

In j=1, examples of the perfluoropolyether group $R_f$ in general formula (A) include groups represented by structural formulae (C), (D) and (E). However, hydrogen atoms of all the alkyl groups need not be substituted with fluorine atoms, and hydrogen atoms may be partly contained.

 (C)

 (D)

 (E)

Examples of the perfluoropolyether-group-containing material constituting the antifouling layer also include a perfluoropolyether having a polar group at a terminal (see Japanese Unexamined Patent Application Publication No. 9-127307), a composition for forming an antifouling film containing an alkoxysilane compound having a perfluoropolyether group having a specific structure (see Japanese Unexamined Patent Application Publication No. 9-255919), and surface modifiers produced by combining an perfluoropolyether-group-containing alkoxysilane compound with various materials (see Japanese Unexamined Patent Application Publication Nos. 9-326240, 10-26701, 10-120442, and 10-148701).

$R^1$ represents a divalent atom or group, and is a group for bonding $R^2$ and perfluoropolyether group $R_f$. $R^1$ is not particularly limited, but preferably an atom or an atomic group other than carbon, such as O, NH, or S, in view of synthesis. $R^2$ is a hydrocarbon group, and the number of carbons in $R^2$ is preferably in the range of 2 to 10. Specific examples of $R^2$ include alkylene groups such as a methylene group, an ethylene group, and a propylene group; and a phenylene group. $R^3$ is an alkyl group constituting an alkoxy group. Examples of $R^3$ generally includes alkyl groups each having 3 or less carbon atoms, namely, an isopropyl group, a propyl group, an ethyl group, and a methyl group. However, the number of carbons in $R^3$ may be 4 or more.

In order to form an antifouling layer, a fluorocarbon resin (for example, an alkoxysilane compound represented by general formula (A)) is generally diluted with a solvent for use. The solvent is not particularly limited, but is selected in consideration of the stability of the composition, the wettability to the surface of the sealing member, the volatility, and the like when the solvent is used. Specific examples thereof include alcohol solvents such as ethyl alcohol, ketone solvents such as acetone, and hydrocarbon solvents such as hexane. Furthermore, these solvents may be used alone or in a mixture of two or more solvents.

The solvent used for dissolving the fluorocarbon resin is selected in consideration of the stability of the composition, the wettability to the surface of the sealing member, the volatility, and the like when the solvent is used. For example, a fluorinated hydrocarbon solvent is used. The fluorinated hydrocarbon solvent is a compound obtained by substituting part of or all the hydrogen atoms of a hydrocarbon solvent, such as an aliphatic hydrocarbon, a cyclic hydrocarbon, or an ether with fluorine atoms. Examples thereof include ZEORORA-HXE (trade name, boiling point: 78° C.) produced by Zeon Corporation; perfluoroheptane (boiling point: 80° C.); perfluorooctane (boiling point: 102° C.); hydrofluoropolyethers such as H-GALDEN-ZV75 (boiling point: 75° C.), H-GALDEN-ZV85 (boiling point: 85° C.), H-GALDEN-ZV100 (boiling point: 95° C.), H-GALDEN-C (boiling point: 130° C.), and H-GALDEN-D (boiling point: 178° C.) and perfluoropolyethers such as SV-110 (boiling point: 110° C.) and SV-135 (boiling point: 135° C.) (trade names) that are produced by Ausimont, Inc.; and perfluoroalkanes, such as FC series, produced by Sumitomo 3M Limited. Among these fluorinated hydrocarbon solvents, in order to obtain an even antifouling layer having a uniform thickness, a solvent having a boiling point in the range of 70° C. to 240° C. is preferably selected as the solvent used for dissolving the fluorine compounds represented by general formula (A), in particular, a hydrofluoropolyether (HFPE) or a hydrofluorocarbon (HFC) is preferably selected, and these solvents are preferably used alone or in a mixture of two or more solvents. When the boiling point is excessively low, for example, the application tends to be uneven. On the other hand, when the boiling point is excessively high, the antifouling layer is not easily dried and it tends to be difficult to form a uniform antifouling layer. HFPEs and HFCs have excellent solubility for the fluorine compounds represented by general formula (A) to provide an excellent coated surface.

A solution prepared by diluting a fluorocarbon resin (e.g., an alkoxysilane compound represented by general formula (A)) in a solvent is applied on the surface of the sealing member. Subsequently, for example, the sealing member is heated to volatilize the solvent and form a bond between the material of the sealing member and the fluorocarbon resin of the antifouling layer. Thus, the antifouling layer can be formed on the surface of the sealing member. Various methods used for general coating operations can be employed as the application method, but spin coating, spray coating, or the like can be preferably employed. Alternatively, in view of workability, the solution may be impregnated into paper, a cloth, or the like and may then be applied. The heating temperature is selected in consideration of heat resistance of the sealing member or the like. For example, when a polyethylene terephthalate resin is used for the sealing member, an appropriate heating temperature is in the range of 30° C. to 80° C.

Since the alkoxysilane compound represented by general formula (A) contains a fluorine compound in its molecule, the alkoxysilane compound has a water-repellent property and an improved antifouling property. Accordingly, characteristics such as abrasion resistance and antifouling property can be further imparted to the surface of the sealing member by forming the antifouling layer containing a perfluoropolyether-group-containing alkoxysilane compound represented by general formula (A).

In addition, as a catalyst for accelerating a reaction between the material of the sealing member and the material of the antifouling layer, at least one material selected, such as, acids, bases, phosphoric esters, and acetylacetone is preferably added to the material of the antifouling layer. Specific examples of the catalyst include acids such as hydrochloric acid, bases such as ammonia, and phosphoric esters such as dilauryl phosphate. The amount of catalyst added is, for example, in the range of $1 \times 10^{-3}$ to 1 millimole/L. When an acid or a base is added, the addition of a carbonyl compound such as acetylacetone increases the reactivity. Therefore, a carbonyl compound is preferably added to the composition for forming the antifouling layer. The amount of carbonyl compound added is, for example, in the range of about $1 \times 10^{-1}$ to $1 \times 10^2$ millimole/L. By adding the catalyst, even when the heating (drying) temperature is decreased, a strong bond can be formed between the sealing member and the antifouling layer. This is advantageous in view of the production process, and the range of materials that can be used as the sealing member can be increased.

The metal oxide nanoparticles according to an embodiment have excellent crystallinity and the surfaces of the metal oxide nanoparticles are coated with a surfactant. Therefore, although the metal oxide nanoparticles have a small particle diameter of $1 \times 10^{-8}$ m or less, the metal oxide nanoparticles have a high refractive index and can be stably dispersed in an organic solvent. Furthermore, since the metal oxide nanoparticles can be homogeneously dispersed in a polymer without agglomeration, an excellent nanoparticle-resin composite material and an excellent optical material can be provided by combining the metal oxide nanoparticles with a polymer.

In the method of producing the metal oxide nanoparticles according to an embodiment, an intermediate product is formed in the course of the process, and liquid-phase annealing is performed, thereby producing metal oxide nanoparticles having excellent crystallinity, which have been difficult to produce by known methods. Specifically, the surface of the intermediate product is modified with a surfactant. Thereby the intermediate product can be dissolved in a second organic solvent while being dispersed therein. Furthermore, crystallization is conducted by performing liquid-phase annealing at a temperature lower than the temperature at which the surfactant is thermally decomposed, while the intermediate product is dispersed in the second organic solvent. Thereby, metal oxide nanoparticles the surfaces of which are coated with the surfactant and which have excellent crystallinity, small particle diameter, and excellent dispersion stability in an organic solvent can be produced at a high yield. Unless the first organic solvent is used, it is difficult to decrease the diameter of the metal oxide nanoparticles. Furthermore, by combining a metal alkoxide with a surfactant, the dispersibility of the final metal oxide nanoparticles can be improved. In addition, since the metal alkoxide having a high reactivity is capped with the surfactant, the reactivity of the metal alkoxide can be reduced. Consequently, metal oxide nanoparticles having an extremely small particle diameter can be produced.

When the metal oxide nanoparticles are composed of core particles and a shell layer, the characteristics (such as environmental resistance) of the core particles can be improved.

Additional features and advantages are described herein, and will be apparent from, the following Detailed Description and the figures.

DETAILED DESCRIPTION

Figure 1:
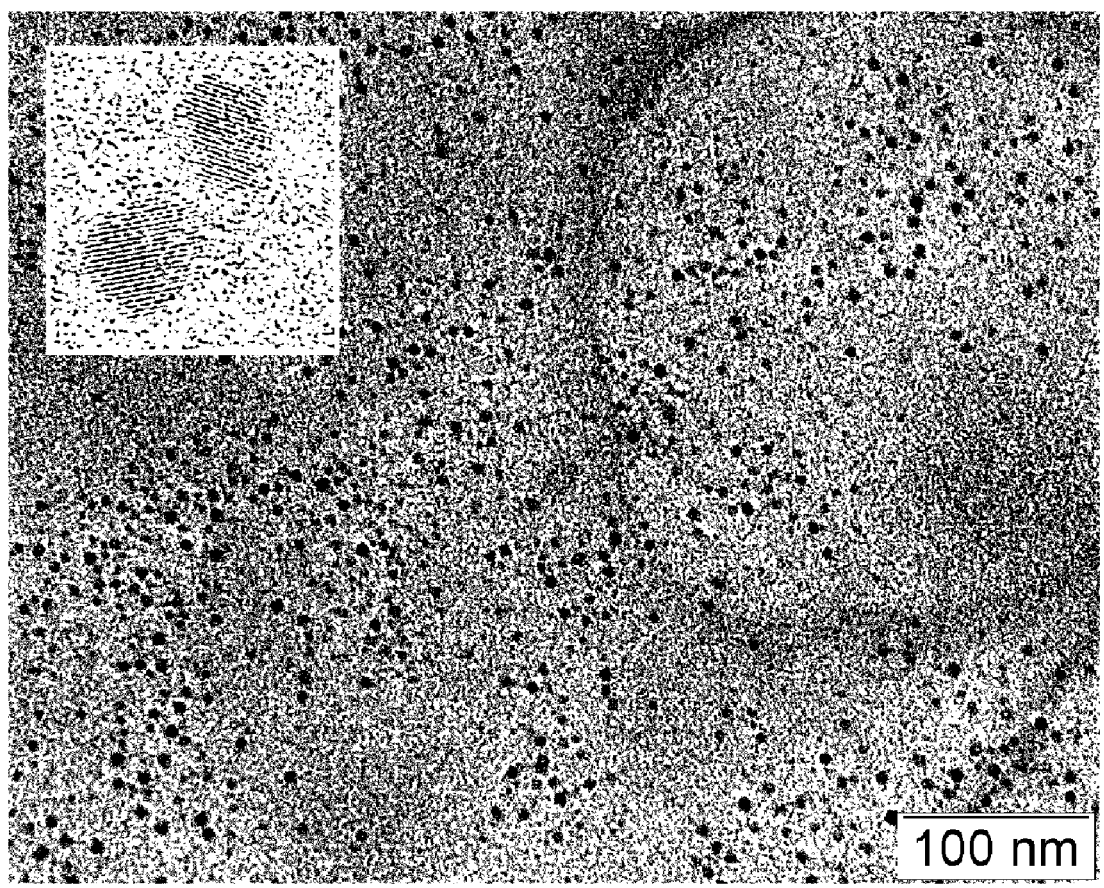
FIG. 1 is a transmission electron microscopy image of the zirconium oxide nanoparticles of Example 1.

The present application will now be described on the basis of preferred examples with reference to the attached drawings. However, the present application is not limited to these examples.

EXAMPLE 1

Example 1 relates to the metal oxide nanoparticles according to the first embodiment and the third embodiment and production methods thereof.

The metal oxide nanoparticles of Example 1 are described as follows on the basis of the metal oxide nanoparticles according to the first embodiment. The metal oxide nanoparticles of Example 1 are composed of an oxide of a metal selected, such as, zirconium, niobium, indium, tin, cerium, hathium, and tantalum, wherein the metal oxide nanoparticles are crystalline and have a particle diameter of $1 \times 10^{-8}$ m or less, and the surfaces of the metal oxide nanoparticles are coated with a surfactant.

The metal oxide nanoparticles of Example 1 are described as follows on the basis of the metal oxide nanoparticles according to the third embodiment. The metal oxide nanoparticles of Example 1 are produced by the steps of (A) mixing a metal alkoxide, a surfactant, and a first organic solvent under an inert atmosphere to prepare a reaction solution, (B) mixing a reaction initiator prepared by mixing a catalyst with a solvent and the reaction solution under an inert atmosphere and heating to produce an intermediate product, (C) mixing the intermediate product with a second organic solvent followed by heating the mixture of the intermediate product and the second organic solvent under an inert atmosphere to prepare metal oxide nanoparticles, and (D) separating and washing the prepared metal oxide nanoparticles, wherein the surfaces of the metal oxide nanoparticles are coated with the surfactant.

The method of producing the metal oxide nanoparticles of Example 1 is described as follows on the basis of the method of producing the metal oxide nanoparticles according to the first embodiment. The method of producing the metal oxide nanoparticles of Example 1 includes the steps of (A) mixing a metal alkoxide, a surfactant, and a first organic solvent under an inert atmosphere to prepare a reaction solution, (B) mixing a reaction initiator prepared by mixing a catalyst with a solvent and the reaction solution under an inert atmosphere and heating to produce an intermediate product, and (C) mixing the intermediate product with a second organic solvent followed by heating the mixture of the intermediate product and the second organic solvent under an inert atmosphere to prepare metal oxide nanoparticles, the surfaces of which are coated with the surfactant.

The method of producing the metal oxide nanoparticles of Example 1 is described as follows on the basis of the method of producing the metal oxide nanoparticles according to the third embodiment. The method of producing the metal oxide nanoparticles of Example 1 includes the steps of performing hydrolysis and condensation by dehydration of a metal alkoxide in the presence of a surfactant to produce an intermediate product, the surface of which is modified with the surfactant, and heating the intermediate product in a liquid phase while the state in which the surface is modified with the surfactant is maintained, thereby producing metal oxide nanoparticles, the surfaces of which are coated with the surfactant.

More specifically, the metal oxide constituting the metal oxide nanoparticles in Example 1 is zirconium oxide ($ZrO_2$). A method of producing the metal oxide nanoparticles of Example 1 will be described below. The following materials were used in the production.

Metal alkoxide: zirconium-tert-butoxide
Surfactant: oleic acid, which is a carboxylic acid containing an olefin chain
First organic solvent: heptadecane
Catalyst: trimethylamine oxide
Solvent to be mixed with catalyst: water
Second organic solvent: dioctyl ether
[Step-100]

First, the metal alkoxide, the surfactant, and the first organic solvent were mixed under an inert atmosphere to prepare a reaction solution. Specifically, 120 mmol of oleic acid serving as the surfactant and 850 mL of heptadecane serving as the first organic solvent were mixed, and deaeration was performed by freeze-drying. Subsequently, 100 mmol of zirconium-tert-butoxide was added to the mixture under a nitrogen gas atmosphere. The resulting solution was heated to 100° C. with an oil bath while being stirred and mixed with a mechanical stirrer under a nitrogen gas atmosphere to prepare a reaction solution. The value of [number of moles of metal alkoxide/volume of organic solvent (unit: liter)] in the reaction solution was $(100 \times 10^{-3})/(850 \times 10^{-3})$= 0.12 mol/L. The molar ratio of [metal alkoxide/surfactant] in the reaction solution was $(100 \times 10^{-3})/(120 \times 10^{-3})$=0.83.

[Step-110]

Subsequently, a reaction initiator prepared by mixing the catalyst with the solvent, and the reaction solution were mixed and heated under an inert atmosphere to produce an intermediate product. Alternatively, hydrolysis and condensation by dehydration of the metal alkoxide were performed in the presence of the surfactant to produce an intermediate product, the surface of which is modified with the surfactant. Specifically, 200 mmol of trimethylamine oxide serving as the base catalyst was dissolved in 100 mL of water serving as the solvent (solvent constituting the reaction initiator) to prepare the reaction initiator. The reaction initiator and the reaction solution prepared in [Step-100] were then mixed and heated to 100° C. with an oil bath while being stirred and mixed with a mechanical stirrer under a nitrogen gas atmosphere to produce an intermediate product. The reaction time was 24 hours. Subsequently, the solution was cooled to 60° C. Appropriate amounts of ethanol and toluene were then added to the solution, and the resulting intermediate product was separated by centrifugal separation. Subsequently, the separated intermediate product was washed with ethanol twice. The molar ratio of [catalyst/metal alkoxide] was $(200 \times 10^{-3})/(100 \times 10^{-3})$=2, and the molar ratio of [solvent constituting reaction initiator/metal alkoxide] was $(100/18)/(100 \times 10^{-3})$=56.

[Step-120]

Subsequently, the intermediate product was mixed with the second organic solvent followed by heating the mixture of the intermediate product and the second organic solvent under an inert atmosphere to prepare metal oxide nanoparticles. Alternatively, the intermediate product was heated in a liquid phase while a state in which the surface of the intermediate product was modified with the surfactant was maintained, thereby producing metal oxide nanoparticles, the surfaces of which are coated with the surfactant. Specifically, the intermediate product prepared in [Step-110] was dissolved in 250 mL of dioctyl ether serving as the second organic solvent. The solution was heated to 280° C. with a mantle heater while being stirred with a mechanical stirrer under a nitrogen gas atmosphere, and kept for 20 hours under this condition to perform liquid-phase annealing. Thus, $ZrO_2$ nanoparticles were prepared.

[Step-130]

Subsequently, the prepared metal oxide nanoparticles were separated and washed. Specifically, the solution was cooled to about room temperature, and an appropriate amount of ethanol was then added. The resulting zirconium oxide nanoparticles were separated by centrifugal separation. The separated zirconium oxide nanoparticles were washed with ethanol twice. A size-selective precipitation was not performed.

The prepared zirconium oxide nanoparticles were stably dispersed in toluene serving as an organic solvent for dispersion. No nondispersed agglomerated particles were observed. It was confirmed that oleic acid was adsorbed on the surfaces of the zirconium oxide nanoparticles by a spectrum obtained by Fourier transform infrared spectroscopy (FT-IR) of the zirconium oxide nanoparticles. The yield was 93%, i.e., 11 g. Thus, the zirconium oxide nanoparticles could be produced with high productivity.

Figure 2A:
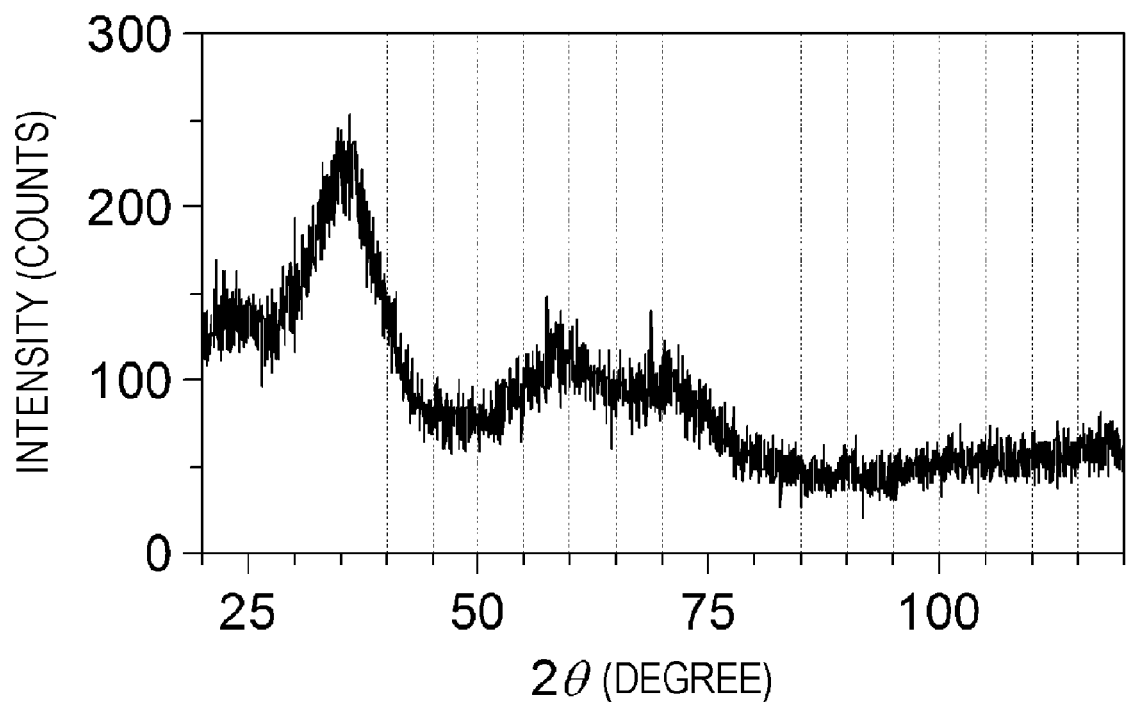
FIGS. 2A and 2B are powder X-ray diffraction spectra (CoKα radiation) of the zirconium oxide nanoparticles of Example 1 and the intermediate product of Comparative Example 1, respectively.

FIG. 1 shows a transmission electron microscopy (TEM) image of the prepared zirconium oxide nanoparticles. The inserted image in FIG. 1 is a high-resolution TEM image. The diameter of all the zirconium oxide nanoparticles was 10 nm or less. That is, the particle diameter was 10 nm or less. More specifically, it was confirmed that the average particle diameter was 4 nm. As shown in FIG. 2A, a powder X-ray diffraction (XRD) spectrum of the zirconium oxide nanoparticles showed that the nanoparticles were crystallized. Furthermore, according to the observation results with a high-resolution TEM, the prepared zirconium oxide nanoparticles were substantially single crystals and had excellent crystallinity. According to an analysis of an electron beam diffraction pattern, the crystal structure of the particles was the tetragonal system and belonged to a space group of $P4_2/nmc$. The expression "the particle diameter of metal oxide nanoparticles is D nm or less" means that when the average of the particle diameter of the metal oxide nanoparticles is represented by $D_{ave}$, and the standard deviation thereof is represented by $\sigma$, a value represented by $D_{ave}+2\sigma$ does not exceed D nm.

A predetermined amount of the prepared zirconium oxide nanoparticles was added to toluene, which is an organic solvent for dispersion, and the $ZrO_2$ nanoparticles were dispersed in toluene using a Dispax-Reactor. The dispersion was added to an acrylic resin (refractive index $n_D$=1.56) or a silicone resin (refractive index $n_D$=1.56), which is a polymer, so that the volume filling rate $\eta$ of the $ZrO_2$ nanoparticles was 5%. The $ZrO_2$ nanoparticles and the resin were homogeneously mixed with a defoaming mixer. Subsequently, toluene was removed from the mixture with an evaporator (preset temperature: 40° C.). Thus, a nanoparticle-resin composite material was produced in which the $ZrO_2$ nanoparticles serving as metal oxide nanoparticles, the surfaces of which are coated with oleic acid serving as the surfactant, were dispersed in the acrylic resin or the silicone resin serving as the polymer.

The refractive index of the prepared nanoparticle-resin composite material was measured with a known Abbe refractometer (produced by ATAGO Co., Ltd., model number: NAR-4T). The measurement wavelength was the D line. The light transmittance of the prepared nanoparticle-resin composite material was measured with a UV-visible spectrophotometer (produced by Hitachi High-Technologies Corporation, model number: U-3410) using a quartz cell with an optical path length of 0.5 mm in the wavelength range of 415 to 800 nm.

Figure 3:
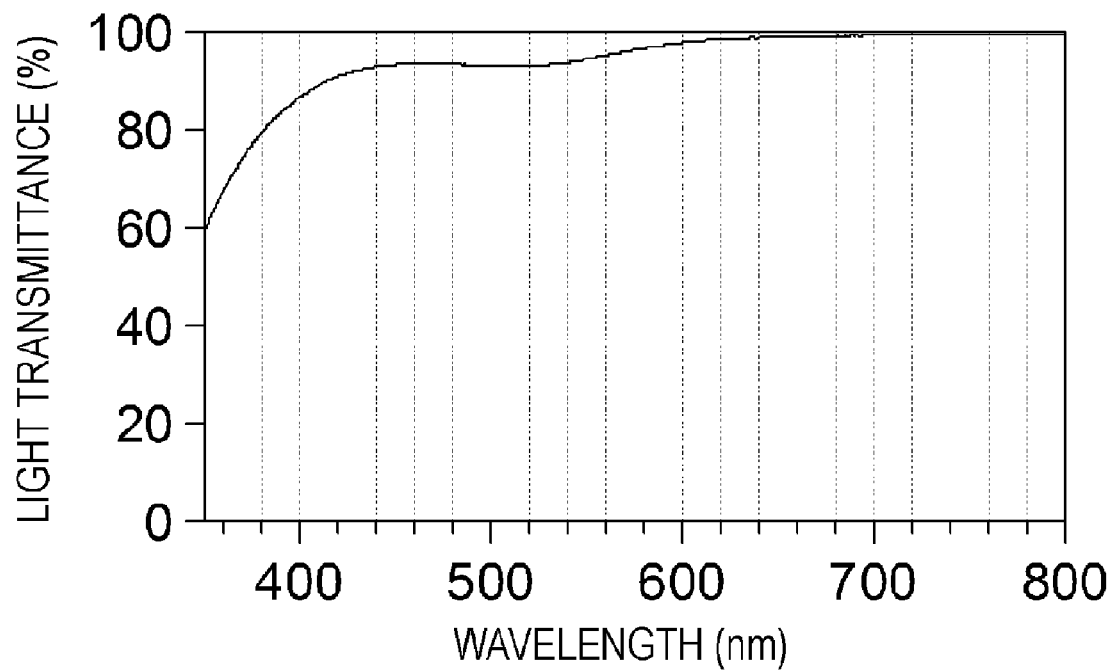
FIG. 3 is a graph showing the light transmittance of a nanoparticle-resin composite material produced from the zirconium oxide nanoparticles of Example 1 measured with a UV-visible spectrophotometer.

The refractive index of the nanoparticle-resin composite material measured with the D line was 0.02 higher than the refractive index $n_D$ of the polymer alone. As shown in FIG. 3, the nanoparticle-resin composite material had a light transmittance of 90% or more. A nanoparticle-resin composite material having a volume filling rate $\eta$ of the $ZrO_2$ nanoparticles of 20% was also produced, and the refractive index of the nanoparticle-resin composite material was measured. The refractive index of the nanoparticle-resin composite material was 0.10 higher than the refractive index $n_D$ of the polymer alone.

EXAMPLE 2

Example 2 is a modification of Example 1. In Example 2, zirconium oxide nanoparticles were produced as in Example 1 except that the oleic acid serving as the surfactant was changed to 300 mmol of hexanoic acid. In Example 2, the time required for producing the intermediate product was about 30 minutes. Zirconium oxide nanoparticles that had a particle diameter of 10 nm or less and excellent crystallinity could be produced at a yield of 97%, i.e., 12 g with high productivity. By using hexanoic acid (number of carbons: 6), which is a surfactant whose chain length is shorter than that of oleic acid (number of carbons: 18), the hydrolyzability of zirconium-tert-butoxide was increased, and the time required for the reaction could be reduced. However, when a surfactant having a chain length shorter than that of hexanoic acid is used, the hydrolyzability of zirconium-tert-butoxide is excessively increased, and an agglomerated intermediate product that is not dispersed may be produced.

EXAMPLE 3

Example 3 is also a modification of Example 1. In Example 3, instead of dioctyl ether, an organic solvent prepared by mixing dioctyl ether and octadecanoic acid (stearic acid) was used as the second organic solvent. In the same step as [Step-120] of Example 1, the annealing temperature during the liquid-phase annealing was changed to 350° C. and the annealing time was changed to five hours. Zirconium oxide nanoparticles were produced as in Example 1 except for these conditions. As a result, zirconium oxide nanoparticles that had a particle diameter of 10 nm or less (average particle diameter: 8 nm) and excellent crystallinity could be produced at a yield of 93%, i.e., 11 g with high productivity.

EXAMPLE 4

Example 4 is also a modification of Example 1. In Example 4, an organic solvent prepared by mixing trimethylamine oxide with dioctyl ether serving as the second organic solvent was used. When the solvent was changed to this mixed organic solvent, in the same step as [Step-120] of Example 1, crystallization of the intermediate product was further accelerated. When the annealing temperature during the liquid-phase annealing was 280° C., about 30 minutes was sufficient for the annealing time, which is a time required for the crystallization. Zirconium oxide nanoparticles that had a particle diameter of 10 nm or less (average particle diameter: 4 nm) and excellent crystallinity could be produced at a yield of 93%, i.e., 11 g with high productivity.

EXAMPLE 5

Example 5 is also a modification of Example 1. In Example 5, trimethylamine oxide, which is a base catalyst, was changed to nitric acid, which is an acid catalyst. Zirconium oxide nanoparticles were produced under the same conditions as those in Example 1 except for this change. As a result, about 30 minutes was sufficient for producing the intermediate product. Zirconium oxide nanoparticles that had a particle diameter of 10 nm or less and excellent crystallinity could be produced at a yield of 97%, i.e., 12 g with high productivity.

EXAMPLE 6

Example 6 is also a modification of Example 1. A method of producing metal oxide nanoparticles of Example 6 will now be described. The following materials were used for producing the zirconium oxide nanoparticles in Example 6. Unlike Example 1, separation and washing of the resulting intermediate product are not performed in Example 6. Therefore, a solution in [Step-610] described below corresponds to the second organic solvent.

Metal alkoxide: zirconium-tert-butoxide
Surfactant: octadecanoic acid (stearic acid)
First organic solvent: heptadecane
Catalyst: trimethylamine oxide
Solvent to be mixed with catalyst: tetraethylene glycol
Second organic solvent: solution in [Step-610]

[Step-600]

First, 600 mmol of stearic acid serving as the surfactant and 680 mL of heptadecane serving as the first organic solvent were mixed, and deaeration was performed by heat-drying under a reduced pressure. Subsequently, 100 mmol of zirconium-tert-butoxide was added to the mixture under a nitrogen gas atmosphere. The resulting solution was heated to 100° C. with an oil bath while being stirred and mixed with a mechanical stirrer under a nitrogen gas atmosphere to prepare a reaction solution. The value of [number of moles of metal alkoxide/volume of organic solvent (unit: liter)] in the reaction solution was $(100 \times 10^{-3})/(680 \times 10^{-3})=0.15$ mol/L. The molar ratio of [metal alkoxide/surfactant] in the reaction solution was $(100 \times 10^{-3})/(600 \times 10^{-3})=0.17$.

[Step-610]

On the other hand, 200 mmol of trimethylamine oxide serving as the base catalyst was dissolved in 100 mL of tetraethylene glycol serving as the solvent (solvent constituting a reaction initiator) to prepare the reaction initiator. The reaction initiator and the reaction solution prepared in [Step-600] were then mixed and heated to 100° C. with an oil bath while being stirred and mixed with a mechanical stirrer under a nitrogen gas atmosphere to produce an intermediate product. Unlike Example 1, separation and washing of the resulting intermediate product were not performed. The molar ratio of [catalyst/metal alkoxide] was $(200 \times 10^{-3})/(100 \times 10^{-3})=2$, and the molar ratio of [solvent constituting reaction initiator/metal alkoxide] was $(100 \times 1.1/190)/(100 \times 10^{-3})=5.8$.

[Step-620]

The intermediate product-containing mixed solution prepared in [Step-610] was heated to 280° C. with a mantle heater while being stirred with a mechanical stirrer under a nitrogen gas atmosphere, and kept for 20 hours under this condition to perform liquid-phase annealing. Thus, $ZrO_2$ nanoparticles were prepared.

[Step-630]

Subsequently, the solution was cooled to about room temperature, and an appropriate amount of ethanol was then added. The resulting zirconium oxide nanoparticles were separated by centrifugal separation. The separated zirconium oxide nanoparticles were washed with ethanol twice. A size-selective precipitation was not performed.

As a result, zirconium oxide nanoparticles that had a particle diameter of 10 nm or less (average particle diameter: 6 nm) and excellent crystallinity could be produced at a yield of 97%, i.e., 12 g with high productivity.

EXAMPLE 7

Example 7 is also a modification of Example 1. In Example 7, the metal oxide constituting metal oxide nanoparticles was niobium pentoxide ($Nb_2O_5$), and niobium pentoxide nanoparticles were produced. A method of producing metal oxide nanoparticles of Example 7 will now be described. The following materials were used for the production.

Metal alkoxide: niobium-n-butoxide
Surfactant: oleic acid, which is a carboxylic acid containing an olefin chain, and oleylamine
First organic solvent: heptadecane
Catalyst: trimethylamine oxide
Solvent to be mixed with catalyst: ethylene glycol
Second organic solvent: trioctylphosphine oxide

[Step-700]

First, 60 mmol of oleic acid and 60 mmol of oleylamine that served as the surfactants, and 850 mL of heptadecane that served as the first organic solvent were mixed, and deaeration was performed by freeze-drying. Subsequently, 40 mmol of niobium-n-butoxide was added to the mixture under a nitrogen gas atmosphere. The resulting solution was heated to 100° C. with an oil bath while being stirred and mixed with a mechanical stirrer under a nitrogen gas atmosphere to prepare a reaction solution. The value of [number of moles of metal alkoxide/volume of organic solvent (unit: liter)] in the reaction solution was $(40 \times 10^{-3})/(850 \times 10^{-3})=0.047$ mol/L. The molar ratio of [metal alkoxide/surfactant] in the reaction solution was $(40 \times 10^{-3})/(60 \times 10^{-3}+60 \times 10^{-3})=0.33$.

[Step-710]

On the other hand, 200 mmol of trimethylamine oxide serving as the base catalyst was dissolved in 110 mL of ethylene glycol serving as the solvent (solvent constituting a reaction initiator) to prepare the reaction initiator. The reaction initiator and the reaction solution prepared in [Step-700] were then mixed and heated to 100° C. with an oil bath while being stirred and mixed with a magnetic stirrer under a nitrogen gas atmosphere to produce an intermediate product. The reaction time was 24 hours. Subsequently, the solution was cooled to 60° C. Appropriate amounts of ethanol and toluene were then added to the solution, and the resulting intermediate product was separated by centrifugal separation. Subsequently, the separated intermediate product was washed with ethanol twice. The molar ratio of [catalyst/metal alkoxide] was $(200 \times 10^{-3})/(40 \times 10^{-3})=5$, and the molar ratio of [solvent constituting reaction initiator/metal alkoxide] was $(110 \times 1.1/62)/(40 \times 10^{-3})=49$.

[Step-720]

The intermediate product prepared in [Step-710] was dissolved in 250 mL of trioctylphosphine oxide serving as a second organic solvent. The solution was heated to 350° C. with a mantle heater while being stirred with a mechanical stirrer under a nitrogen gas atmosphere, and kept for 20 hours under this condition to perform liquid-phase annealing. Thus, $Nb_2O_5$ nanoparticles were prepared.

[Step-730]

Subsequently, the solution was cooled to about room temperature, and an appropriate amount of ethanol was then added. The resulting niobium pentoxide nanoparticles were separated by centrifugal separation. The separated niobium pentoxide nanoparticles were washed with ethanol twice. A size-selective precipitation was not performed.

The prepared niobium pentoxide nanoparticles were stably dispersed in toluene. No nondispersed agglomerated particles were observed. It was confirmed that oleic acid and oleylamine were adsorbed on the surfaces of the niobium pentoxide nanoparticles by an FT-IR spectrum of the niobium pentoxide nanoparticles. The yield was 98%, i.e., 5.2 g. Thus, the niobium pentoxide nanoparticles could be produced with high productivity. The diameter of all the niobium pentoxide nanoparticles was 10 nm or less. That is, the particle diameter was 10 nm or less.

The prepared niobium pentoxide nanoparticles were homogeneously dispersed in a polymer to produce a transparent nanoparticle-resin composite material. The refractive index of the nanoparticle-resin composite material was higher than the refractive index of the polymer alone. Furthermore, the change in refractive index due to a temperature change was decreased, and a more stable temperature-dependent characteristic was exhibited.

EXAMPLE 8

Example 8 is a modification of Example 7. An alcohol elimination process for an intermediate product was performed in Example 8. A method of producing metal oxide nanoparticles of Example 8 will now be described. The following materials were used in Example 8.

Metal alkoxide: niobium-n-butoxide
Surfactant: stearic acid and stearylamine
First organic solvent: heptadecane
Catalyst: trimethylamine oxide
Solvent to be mixed with catalyst: water
Second organic solvent: stearic acid

[Step-800]

First, 250 mmol of stearic acid and 250 mmol of stearylamine that served as the surfactants, and 180 mL of heptadecane that served as the first organic solvent were mixed, and deaeration was performed by heat-drying under a reduced pressure. Subsequently, 40 mmol of niobium-n-butoxide was added to the mixture under a nitrogen gas atmosphere. The resulting solution was heated to 100° C. with an oil bath while being stirred and mixed with a mechanical stirrer under a nitrogen gas atmosphere to prepare a reaction solution. The value of [number of moles of metal alkoxide/volume of organic solvent (unit: liter)] in the reaction solution was $(40\times10^{-3})/(180\times10^{-3})=0.22$ mol/L. The molar ratio of [metal alkoxide/surfactant] in the reaction solution was $(40\times10^{-3})/(250\times10^{-3}+250\times10^{-3})=0.08$.

[Step-810]

On the other hand, 100 mmol of trimethylamine oxide serving as the base catalyst was dissolved in 50 mL of water serving as the solvent (solvent constituting a reaction initiator) to prepare the reaction initiator. The reaction initiator and the reaction solution prepared in [Step-800] were then mixed and heated to 100° C. with an oil bath while being stirred and mixed with a magnetic stirrer under a nitrogen gas atmosphere to produce an intermediate product. The reaction time was 24 hours. Subsequently, the solution was cooled to 60° C. Appropriate amounts of ethanol and toluene were then added to the solution, and the resulting intermediate product was separated by centrifugal separation. Subsequently, the separated intermediate product was washed with ethanol twice. The molar ratio of [catalyst/metal alkoxide] was $(100\times10^{-3})/(40\times10^{-3})=2.5$, and the molar ratio of [solvent constituting reaction initiator/metal alkoxide] was $(50/18)/(40\times10^{-3})=69$.

[Step-820]

An FT-IR spectrum of the intermediate product showed that alkoxy groups remained in the intermediate product. Therefore, an alcohol elimination process for the intermediate product was performed to reduce the residual alkoxy groups. Specifically, in the alcohol elimination process, the intermediate product was mixed with water in a pressure-resistant container, and the mixture was heated at 120° C. for three hours.

[Step-830]

The intermediate product obtained after the alcohol elimination process was dissolved in 250 mL of stearic acid serving as the second organic solvent. The mixture was heated to 400° C. with a mantle heater while being stirred with a mechanical stirrer under a nitrogen gas atmosphere, and kept for five hours under this condition to perform liquid-phase annealing. Thus, $Nb_2O_5$ nanoparticles were prepared.

[Step-840]

Subsequently, the solution was cooled to about room temperature, and an appropriate amount of ethanol was then added. The resulting niobium pentoxide nanoparticles were separated by centrifugal separation. The separated niobium pentoxide nanoparticles were washed with ethanol twice. A size-selective precipitation was not performed.

Figure 4:
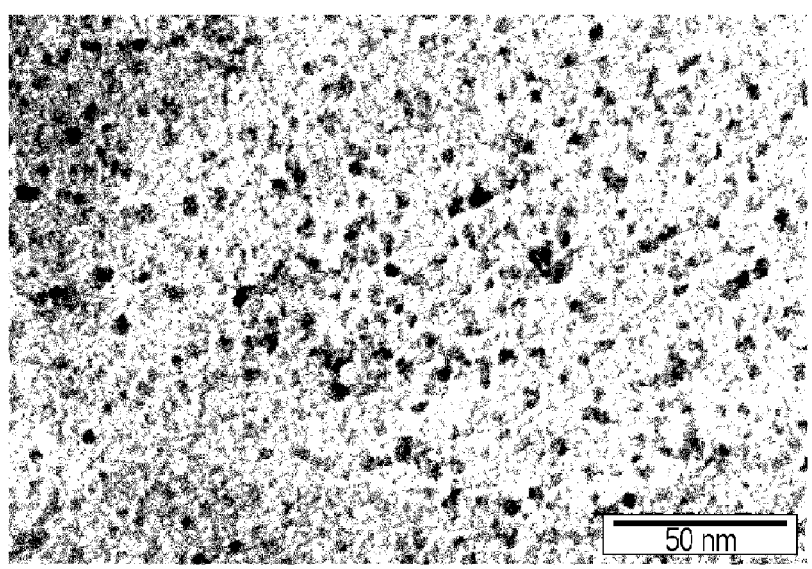
FIG. 4 is a transmission electron microscopy image of the niobium pentoxide nanoparticles of Example 8.

FIG. 4 shows a transmission electron microscopy image of the prepared niobium pentoxide nanoparticles. The diameter of all the niobium pentoxide nanoparticles was 10 nm or less. That is, the particle diameter was 10 nm or less. The niobium pentoxide nanoparticles had excellent crystallinity, and the surfaces of the nanoparticles were coated with stearic acid. The niobium pentoxide nanoparticles were stably dispersed in an organic solvent. The yield was 98%, i.e., 5.2 g. Thus, the niobium pentoxide nanoparticles could be produced with high productivity. The prepared niobium pentoxide nanoparticles were homogeneously dispersed in a polymer to produce a transparent nanoparticle-resin composite material. The refractive index of the nanoparticle-resin composite material was higher than the refractive index of the polymer alone. Furthermore, the change in refractive index due to a temperature change was decreased, and a more stable temperature-dependent characteristic was exhibited.

EXAMPLE 9

Example 9 is a modification of Example 8. In Example 9, trimethylamine oxide, which is a base catalyst, was changed to nitric acid, which is an acid catalyst. Niobium pentoxide nanoparticles were produced under the same conditions as those in Example 8 except for this change. As a result, about 30 minutes was sufficient for forming the intermediate product. Niobium pentoxide nanoparticles that had a particle diameter of 10 nm or less and excellent crystallinity could be produced at a yield of 98%, i.e., 5.2 g with high productivity.

EXAMPLE 10

Example 10 is also a modification of Example 8. In Example 10, an organic solvent prepared by mixing trimethylamine oxide with stearic acid serving as the second organic solvent was used. When the solvent was changed to this mixed organic solvent, in the same step as [Step-830] of Example 8, crystallization of the intermediate product was further accelerated. When the annealing temperature during the liquid-phase annealing was 300° C., about three hours was sufficient for the annealing time, which is a time required for the crystallization. When the annealing temperature during the liquid-phase annealing was 400° C., about 30 minutes was sufficient for the annealing time. Niobium pentoxide nanoparticles that had a particle diameter of 10 nm or less and excellent crystallinity could be produced at a yield of 98%, i.e., 5.2 g with high productivity.

EXAMPLE 11

Example 11 relates to the metal oxide nanoparticles according to the second embodiment and the fourth embodiment and production methods thereof.

The metal oxide nanoparticles of Example 11 are described as follows on the basis of the metal oxide nanoparticles according to the second embodiment. The metal oxide nanoparticles of Example 11 include core particles composed of an oxide of a metal selected, such as, titanium, zirconium, niobium, indium, tin, cerium, hafnium, and tantalum, and a crystalline shell layer that is composed of an oxide of a metal selected, such as, zirconium, niobium, indium, tin, cerium, hafnium, and tantalum, and that is composed of an oxide of a metal different from the metal constituting the core particles, and that coats the core particles, wherein the particle diameter is $1\times10^{-8}$ m or less, and the surface of the shell layer is coated with a surfactant.

The metal oxide nanoparticles of Example 11 are described as follows on the basis of the metal oxide nanoparticles according to the fourth embodiment. The metal oxide nanoparticles of Example 11 are produced by the steps of (A) mixing a metal alkoxide, a surfactant, a first organic solvent, and core particles composed of an oxide of a metal different from the metal constituting the metal alkoxide under an inert atmosphere to prepare a reaction solution, (B) mixing a reaction initiator prepared by mixing a catalyst with a solvent and the reaction solution under an inert atmosphere and heating to produce an intermediate product coating the surfaces of the core particles, (C) mixing the core particles, the surfaces of which are coated with the intermediate product, with a second organic solvent followed by heating the mixture of the core particles and the second organic solvent under an inert atmosphere to prepare metal oxide nanoparticles wherein the surfaces of the core particles are coated with a shell layer composed of an oxide of the metal constituting the metal alkoxide, and (D) separating and washing the prepared metal oxide nanoparticles, wherein the surface of the shell layer is coated with the surfactant.

The method of producing the metal oxide nanoparticles of Example 11 is described as follows on the basis of the method of producing the metal oxide nanoparticles according to the second embodiment. The method of producing the metal oxide nanoparticles of Example 11 includes the steps of (A) mixing a metal alkoxide, a surfactant, a first organic solvent, and core particles composed of an oxide of a metal different from the metal constituting the metal alkoxide under an inert atmosphere to prepare a reaction solution, (B) mixing a reaction initiator prepared by mixing a catalyst with a solvent and the reaction solution under an inert atmosphere and heating to produce an intermediate product coating the surfaces of the core particles, and (C) mixing the core particles, the surfaces of which are coated with the intermediate product, with a second organic solvent followed by heating the mixture of the core particles and the second organic solvent under an inert atmosphere to prepare metal oxide nanoparticles wherein the surfaces of the core particles are coated with a shell layer composed of an oxide of the metal constituting the metal alkoxide, and the surface of the shell layer is coated with the surfactant.

The method of producing the metal oxide nanoparticles of Example 11 is described as follows on the basis of the method of producing the metal oxide nanoparticles according to the fourth embodiment. The method of producing the metal oxide nanoparticles of Example 11 includes the steps of performing hydrolysis and condensation by dehydration of a metal alkoxide in the presence of core particles composed of an oxide of a metal different from the metal constituting the metal alkoxide and a surfactant to produce an intermediate product coating the core particles, the surface of the intermediate product being modified with the surfactant, and heating the intermediate product in a liquid phase while the state in which the surface is modified with the surfactant is maintained, thereby producing metal oxide nanoparticles each including a shell layer composed of a metal oxide, the surface of the shell layer being coated with the surfactant, and a core particle coated with the shell layer.

More specifically, in Example 11, the metal oxide constituting the core particles of the metal oxide nanoparticles is titanium oxide ($TiO_2$), and the metal oxide constituting the shell layer is zirconium oxide ($ZrO_2$). A method of producing the metal oxide nanoparticles of Example 11 will be described below. The following materials were used in the production.

Metal alkoxide: zirconium-tert-butoxide
Surfactant: oleic acid, which is a carboxylic acid containing an olefin chain
First organic solvent: heptadecane
Catalyst: trimethylamine oxide
Solvent to be mixed with catalyst: water
Second organic solvent: dioctyl ether

[Step-1100]

First, the metal alkoxide, the surfactant, the first organic solvent, and core particles composed of an oxide of a metal different from the metal constituting the metal alkoxide were mixed under an inert atmosphere to prepare a reaction solution. Specifically, 120 mmol of oleic acid serving as the surfactant, 850 mL of heptadecane serving as the first organic solvent, and 100 mmol of titanium oxide nanoparticles that are coated with oleic acid and that have an average particle diameter of 5 nm were mixed, and deaeration was performed by heat-drying under a reduced pressure. Subsequently, 100 mmol of zirconium-tert-butoxide was added to the mixture under a nitrogen gas atmosphere. The resulting solution was heated to 100° C. with an oil bath while being stirred and mixed with a mechanical stirrer under a nitrogen gas atmosphere to prepare a reaction solution. The value of [number of moles of metal alkoxide/volume of organic solvent (unit: liter)] in the reaction solution was $(100\times10^{-3})/(850\times10^{-3})=0.12$ mol/L. The molar ratio of [metal alkoxide/surfactant] in the reaction solution was $(100\times10^{-3})/(120\times10^{-3})=0.83$.

[Step-1110]

Subsequently, a reaction initiator prepared by mixing the catalyst with the solvent and the reaction solution were mixed under an inert atmosphere and heating to produce an intermediate product coating the surfaces of the core particles. Alternatively, hydrolysis and condensation by dehydration of the metal alkoxide were performed in the presence of core particles composed of an oxide of a metal different from the metal constituting the metal alkoxide and the surfactant to produce an intermediate product coating the core particles, the surface of the intermediate product being modified with the surfactant. Specifically, 200 mmol of trimethylamine oxide serving as the base catalyst was dissolved in 100 mL of water serving as the solvent (solvent constituting the reaction initiator) to prepare the reaction initiator. The reaction initiator and the reaction solution prepared in [Step-1100] were then mixed and heated to 100° C. with an oil bath while being stirred and mixed with a mechanical stirrer under a nitrogen gas atmosphere to produce an intermediate product. The reaction time was 24 hours. Subsequently, the solution was cooled to 60° C. Appropriate amounts of ethanol and toluene were then added to the solution, and the resulting intermediate product was separated by centrifugal separation. Subsequently, the separated intermediate product was washed with ethanol twice. The molar ratio of [catalyst/metal alkoxide] was $(200\times10^{-3})/(100\times10^{-3})=2$, and the molar ratio of [solvent constituting reaction initiator/metal alkoxide] was $(100/18)/(100\times10^{-3})=56$.

[Step-1120]

Subsequently, the core particles, the surfaces of which are coated with the intermediate product, were mixed with the second organic solvent followed by heating the mixture of the core particles and the second organic solvent under an inert atmosphere to prepare metal oxide nanoparticles wherein the surfaces of the core particles were coated with a shell layer composed of an oxide of the metal constituting the metal alkoxide, and the surface of the shell layer was coated with the surfactant. Alternatively, the intermediate product was heated in a liquid phase while the state in which the surface was modified with the surfactant was maintained, thereby producing metal oxide nanoparticles each including a shell layer composed of a metal oxide, the surface of the shell layer being coated with the surfactant, and a core particle coated with the shell layer. Specifically, the titanium oxide nanoparticles that were coated with the intermediate product and prepared in [Step-1110] were dissolved in 250 mL of dioctyl ether serving as the second organic solvent. The solution was heated to 280° C. with a mantle heater while being stirred with a mechanical stirrer under a nitrogen gas atmosphere, and kept for 20 hours under this condition to perform liquid-phase annealing. Thus, metal oxide nanoparticles wherein the surfaces of the core particles were coated with a shell layer composed of $ZrO_2$ and the surface of the shell layer was coated with oleic acid, i.e. the surfactant, were prepared.

[Step-1130]

Subsequently, the prepared metal oxide nanoparticles were separated and washed. Specifically, the solution was cooled to about room temperature, and an appropriate amount of ethanol was then added. The resulting nanoparticles were separated by centrifugal separation. The separated nanoparticles were washed with ethanol twice. A size-selective precipitation was not performed.

The metal oxide nanoparticles including core particles composed of titanium oxide and a shell layer that was composed of zirconium oxide and that coated the surfaces of the core particles, the surface of the shell layer being coated with oleic acid serving as a surfactant, were stably dispersed in toluene. No nondispersed agglomerated particles were observed. The particle diameter of the metal oxide nanoparticles was 10 nm or less (average particle diameter: 6 nm). Thus, metal oxide nanoparticles including a shell layer with excellent crystallinity could be produced at a yield of 93%, i.e., 19 g with high productivity.

The prepared metal oxide nanoparticles were homogeneously dispersed in a polymer to produce a transparent nanoparticle-resin composite material. The refractive index of the nanoparticle-resin composite material was higher than the refractive index of the polymer alone. Furthermore, the nanoparticle-resin composite material had excellent environmental resistance compared with that of a nanoparticle-resin composite material prepared by using titanium oxide nanoparticles.

COMPARATIVE EXAMPLE 1

Figure 2B:
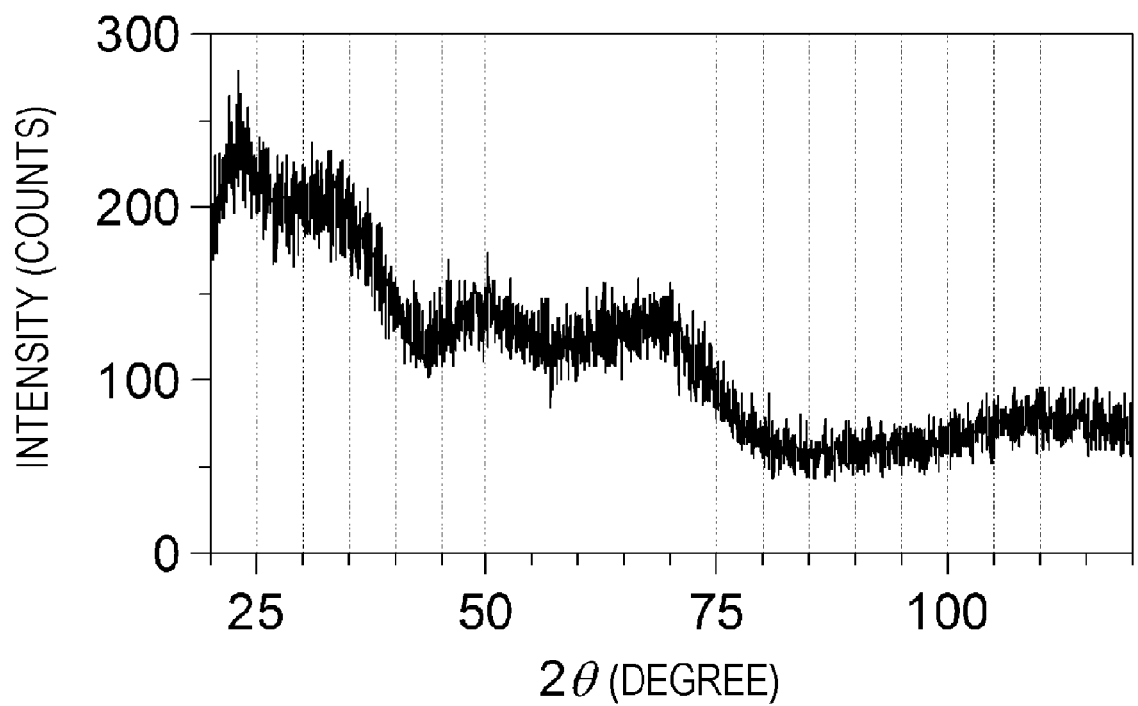

In Comparative Example 1, [Step-120] of Example 1 was not performed, and [Step-130] was performed after [Step-110]. An FT-IR spectrum of the prepared sample (intermediate product) showed that oleic acid was adsorbed on the surface of the intermediate product. However, as shown in FIG. 2B, according to a powder XRD spectrum of the intermediate product, crystallinity of the intermediate product was not satisfactory compared with the zirconium oxide nanoparticles of Example 1.

COMPARATIVE EXAMPLE 2

In Comparative Example 2, [Step-820] and [Step-830] of Example 8 were not performed, and [Step-840] was performed after [Step-810]. According to a powder XRD spectrum of the prepared sample (intermediate product), crystallinity of the intermediate product was not satisfactory compared with the niobium pentoxide nanoparticles of Example 8.

EXAMPLE 12

Figure 5A:
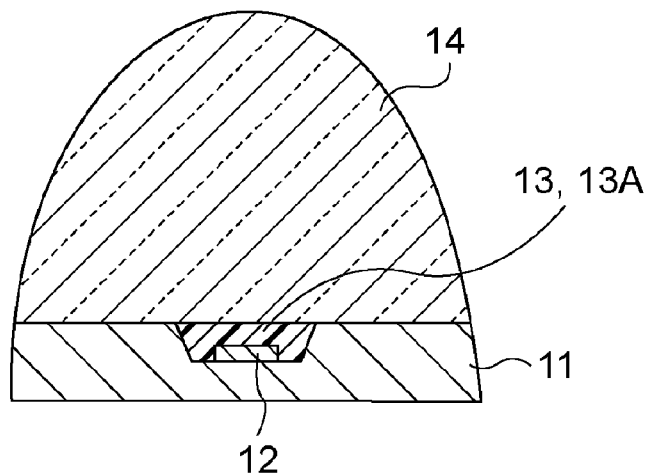
FIG. 5A is a schematic cross-sectional view of the light-emitting element assembly of Example 12.

Example 12 relates to a light-emitting element assembly according to the first embodiment and an optical material according to an embodiment. FIG. 5A is a schematic cross-sectional view of the light-emitting element assembly of Example 12. The light-emitting element assembly of Example 12 includes (a) a light-emitting element (light-emitting diode) 12, (b) a sealing member 14 that seals the light-emitting element 12, and (c) a filling material 13 filled in a space disposed between the light-emitting element 12 and the sealing member 14. The filling material (filling material for the light-emitting element assembly) or the optical material is composed of a nanoparticle-resin composite material 13A based on any one of Example 1 to Example 11.

More specifically, the light-emitting element assembly includes a reflective cup 11 having a recess (corresponding to the space), the light-emitting element 12 disposed in the recess of the reflective cup 11, the filling material 13 composed of the nanoparticle-resin composite material 13A, and the sealing member 14 that has the shape of an artillery shell and that is composed of a transparent material (for example, a polycarbonate resin having a refractive index of 1.6). The filling material 13 fills the recess of the reflective cup 11 so as to seal the light-emitting element 12. The sealing member 14 is disposed as a lid of the recess of the reflective cup 11 so as to seal the light-emitting element 12 and the nanoparticle-resin composite material 13A.

Thus, according to the light-emitting element assembly of Example 12, the transparent nanoparticle-resin composite material 13A having a high refractive index is used as the filling material (sealing material) 13. Thereby, a phenomenon in which light emitted from the light-emitting element 12 is totally reflected on the interface between the light-emitting element 12 and the filling material 13 can be substantially prevented. Furthermore, a phenomenon in which light emitted from the light-emitting element 12 is totally reflected on the interface between the filling material 13 and the sealing member 14 can be substantially prevented. Consequently, the light extraction efficiency can be improved.

When the light-emitting element assembly of Example 12 is used as a light source in a planar light source device (backlight) of a liquid crystal display device, and light is emitted from the light-emitting diode serving as the light-emitting element only in the direction of the z-axis, unevenness of luminance may be generated in the planar light source device. In order to prevent such a phenomenon, a two-dimensional direction emitting structure may be used. According to this structure, a light-emitting diode assembly in which a light extraction lens serving as a sealing member is attached to a light-emitting diode is used as a light source, and light emitted from the light-emitting diode is totally reflected on the top face of the light extraction lens and emitted mainly in the horizontal direction of the light extraction lens.

Figure 5B:
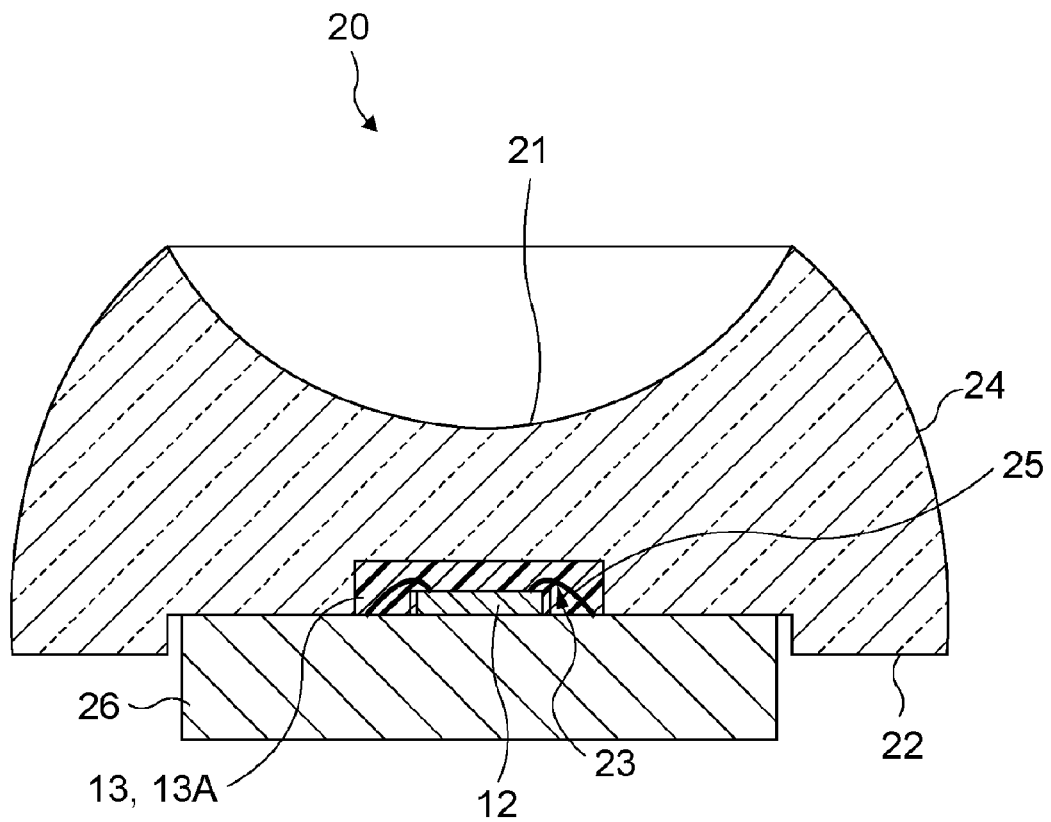
FIG. 5B is a schematic cross-sectional view of the light-emitting element assembly of Example 12 including a light extraction lens.

More specifically, a two-dimensional direction emitting structure shown in the schematic view of FIG. 5B may be used. In the two-dimensional direction emitting structure shown in FIG. 5B, a light-emitting element assembly in which a light extraction lens 20 is attached to a light-emitting element (light-emitting diode) 12 is used as a light source, and light emitted from the light-emitting element 12 is totally reflected on a part of the top face 21 of the light extraction lens 20 and emitted mainly in the horizontal direction of the light extraction lens 20. In FIG. 5B, the light extraction lens 20 includes a bottom face 22 and a side face 24. A recess (space) 23 is provided on the bottom face 22 of the light extraction lens 20, and the light-emitting element 12 is disposed in the recess 23. The recess 23 is filled with a filling material 13 composed of a nanoparticle-resin composite material 13A. The light-emitting element assembly includes a substrate 26 and wiring 25 connecting the light-emitting element 12 to wiring parts (not shown) provided on the substrate 26. The material of the light extraction lens 20 includes the above-described transparent material constituting the sealing member 14.

The light extraction lens 20 shown in FIG. 5B is a light extraction lens described in Japanese Patent Application No. 2005-300117, and includes the round bottom face 22, the side face 24, and the top face 21. The planar light source (light-emitting element 12) having a finite size is disposed at the center of the bottom face 22. When the center of the bottom face 22 is defined as the origin, and a cylindrical coordinate (r, φ, z) is assumed in which the normal line passing through the center of the bottom face 22 is the z-axis, the following is satisfied. The top face 21 is composed of an aspheric surface that is rotationally symmetric with respect to the z-axis. Among semi- or total solid angle radiation emitted from the planar light source, some of the radiation components having a polar angle smaller than the polar angle $\theta_0$ at a part where the side face 24 intersects with the top face 21 are totally reflected on the aspheric surface of the top face 21. The side face 24 is composed of an aspheric surface that is rotationally symmetric with respect to the z-axis. Among the semi- or total solid angle radiation emitted from the planar light source, radiation components having a polar angle larger than the polar angle $\theta_0$ and radiation components that are totally reflected on the top face 21 are transmitted through the aspheric surface of the side face 24. Furthermore, in a function $r=f_s(z)$ in which z that represents the side face 24 composed of the aspheric surface is a variable, the z coordinate at a part where the side face 24 intersects with the top face 21 is represented by $z_1$. In this case, when z decreases in a closed interval of $0 \leq z \leq z_1$, the function $r=f_s(z)$ monotonically increases and has at least one point at which the absolute value $|d^2r/dz^2|$ of the second-order differential coefficient of z becomes a local maximum in the closed interval.

However, the light extraction lens is not limited to the light extraction lens 20 shown in FIG. 5B and may be a light extraction lens having any other configurations and structures.

In the light-emitting element assembly, an antifouling layer may be provided on the surface of the sealing member 14 or the light extraction lens 20.

Specifically, a composition for forming the antifouling layer was prepared as follows. Two parts by weight of alkoxysilane compound having perfluoropolyether groups at both terminals (having an average molecular weight of about 4,000 and the following chemical formula) serving as a fluorocarbon resin was dissolved in 200 parts by weight of hydrofluoropolyether, which is a fluorocarbon solvent with a boiling point of 130° C., (produced by Solvay Solexis, trade name: H-GALDEN). Furthermore, 0.08 parts by weight of perfluoropolyether phosphate was added as a catalyst to prepare a homogeneous solution. The solution was then filtered with a membrane filter to prepare the composition for forming the antifouling layer. The composition for forming the antifouling layer was applied on the surface of the sealing member 14 with a spraying device and was then dried at 70° C. for one hour. Thus, a light-emitting element assembly in which the antifouling layer was formed on the surface of the sealing member 14 was produced.

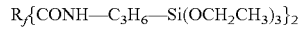

Corn starch was sprinkled on the sealing member 14 of the prepared light-emitting element assembly, and the corn starch was then removed with an air gun. The surface of the sealing member 14 was then observed with an optical microscope. According to the result of the observation, the corn starch was completely removed.

A light-emitting element assembly was produced as in the above-described assembly except that a resin (average molecular weight: about 2,000) having the following chemical formula was used as the fluorocarbon resin. Corn starch was sprinkled on the sealing member 14 of the light-emitting element assembly, and the corn starch was then removed with an air gun. The surface of the sealing member 14 was then observed with an optical microscope. According to the result of the observation, the corn starch was completely removed.

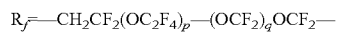

Furthermore, a light-emitting element assembly was produced as in the above-described assembly except that a resin (average molecular weight: about 650) having the following chemical formula was used as the fluorocarbon resin. Corn starch was sprinkled on the sealing member 14 of the light-emitting element assembly, and the corn starch was then removed with an air gun. The surface of the sealing member 14 was then observed with an optical microscope. According to the result of the observation, the corn starch was completely removed.

EXAMPLE 13

Figure 6:
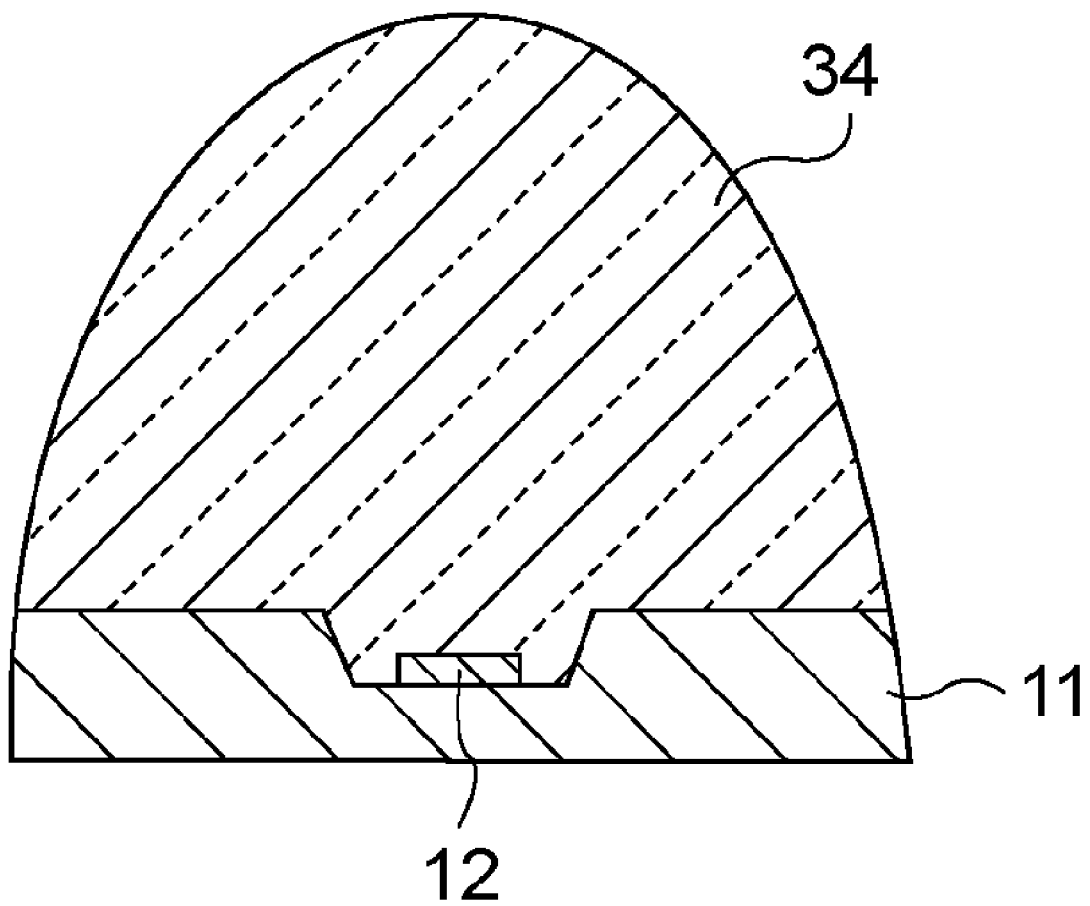
FIG. 6 is a schematic cross-sectional view of the light-emitting element assembly of Example 13.

Example 13 relates to a light-emitting element assembly according to the second embodiment and an optical material according to an embodiment. FIG. 6 is a schematic cross-sectional view of the light-emitting element assembly of Example 13. The light-emitting element assembly of Example 13 includes (a) a light-emitting element (light-emitting diode) 12 and (b) a sealing member 34 that seals the light-emitting element 12. The sealing member 34 or the optical material is composed of a nanoparticle-resin composite material 13A based on any one of Example 1 to Example 11.

More specifically, the light-emitting element assembly includes a reflective cup 11 having a recess (corresponding to a space), the light-emitting element 12 disposed in the recess of the reflective cup 11, and the sealing member 34 that is disposed so as to seal the light-emitting element 12.

Thus, according to the light-emitting element assembly of Example 13, the sealing member 34 is composed of the transparent nanoparticle-resin composite material 13A having a high refractive index. Thereby, a phenomenon in which light emitted from the light-emitting element 12 is totally reflected on the interface between the light-emitting element 12 and the sealing member 34 can be substantially prevented. Consequently, the light extraction efficiency can be improved.

Instead of the sealing member 34, the light-emitting element assembly may include the light extraction lens described in Example 12, which is composed of the nanoparticle-resin composite material based on any one of Example 1 to Example 11. Furthermore, the antifouling layer described in Example 12 may be formed on the surface of the sealing member 34.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light-emitting element assembly comprising:
   (a) a light-emitting element;
   (b) a sealing member that seals the light-emitting element; and
   (c) a filling material filled in a space disposed between the light-emitting element and the sealing member,
   wherein the filling material comprises a nanoparticle-resin composite material in which metal oxide nanoparticles are dispersed in a polymer, the metal oxide nanoparticles including an oxide of a metal selected from the group consisting of zirconium, niobium, indium, tin, cerium, hafnium, and tantalum,
   wherein the metal oxide nanoparticles are crystalline and have a particle diameter of $1\times10^{-8}$ m or less,
   wherein surfaces of the metal oxide nanoparticles are coated with a surfactant, and
   wherein the metal oxide nanoparticles are crystallized at a temperature greater than or equal to 200° C. and less than or equal to 400° C.

2. The light-emitting element assembly according to claim 1, wherein the metal oxide nanoparticles comprise:
   core particles composed of the oxide; and
   a crystalline shell layer composed of an oxide of a metal selected from the group consisting of zirconium, niobium, indium, tin, cerium, hafnium, and tantalum,
   wherein the metal of the shell layer is different from the metal of the core particles, and
   wherein the crystalline shell layer coats the core particles and the surfactant coats the crystalline shell layer.

3. The light-emitting element assembly according to claim 1, wherein the surfactant is selected from the group consisting of: hexanoic acid, octanoic acid, decanoic acid, dodecanoic acid, hexadecanoic acid, octadecanoic acid (stearic acid), oleic acid, linoleic acid, benzoic acid, acetylbenzoic acid, diphenyl-4-benzoic acid, phenylacetic acid, diphenylacetic acid, methylbenzoic acid, butylbenzoic acid, phenoxyacetic acid, phenoxybenzoic acid, phenylbutyric acid, diphenylphosphinic acid, phenylphosphonic acid, benzenesulfonic acid, dodecylbenzenesulfonic acid, decanethiol, dodecanethiol, octadecanethiol, 1-adamantanecarboxylic acid, oleylamine, stearylamine, trioctylphosphine oxide, cetyltrimethylammonium chloride, cetyltrimethylammonium bromide, didodecyldimethylammonium bromide and mixtures thereof.

4. The light-emitting element assembly according to claim 1, wherein the surfactant is selected from the group consisting of oleic acid, hexanoic acid, octadecanoic acid, a mixture of oleic acid and oleylamine and a mixture of octadecanoic acid and stearylamine.

5. A light-emitting element assembly comprising:
   (a) a light-emitting element; and
   (b) a sealing member that seals the light-emitting element;
   wherein the sealing member comprises a nanoparticle-resin composite material in which metal oxide nanoparticles are dispersed in a polymer, the metal oxide nanoparticles including an oxide of a metal selected from the group consisting of zirconium, niobium, indium, tin, cerium, hafnium, and tantalum,
   wherein the metal oxide nanoparticles are crystalline and have a particle diameter of $1\times10{-8}$ m or less,
   wherein surfaces of the metal oxide nanoparticles are coated with a surfactant, and
   wherein the metal oxide nanoparticles are crystallized at a temperature greater than or equal to 200° C. and less than or equal to 400° C.

6. The light-emitting element assembly according to claim 5, wherein the metal oxide nanoparticles comprise:
   core particles composed of the oxide; and
   a crystalline shell layer composed of an oxide of a metal selected from the group consisting of zirconium, niobium, indium, tin, cerium, hafnium, and tantalum,
   wherein the metal of the shell layer is different from the metal of the core particles, and
   wherein the crystalline shell layer coats the core particles and the surfactant coats the crystalline shell layer.

7. The light-emitting element assembly according to claim 5, wherein the surfactant is selected from the group consisting of: hexanoic acid, octanoic acid, decanoic acid, dodecanoic acid, hexadecanoic acid, octadecanoic acid (stearic acid), oleic acid, linoleic acid, benzoic acid, acetylbenzoic acid, diphenyl-4-benzoic acid, phenylacetic acid, diphenylacetic acid, methylbenzoic acid, butylbenzoic acid, phenoxyacetic acid, phenoxybenzoic acid, phenylbutyric acid, diphenylphosphinic acid, phenylphosphonic acid, benzenesulfonic acid, dodecylbenzenesulfonic acid, decanethiol, dodecanethiol, octadecanethiol, 1-adamantanecarboxylic acid, oleylamine, stearylamine, trioctylphosphine oxide, cetyltrimethylammonium chloride, cetyltrimethylammonium bromide, didodecyldimethylammonium bromide and mixtures thereof.

8. The light-emitting element assembly according to claim 5, wherein the surfactant is selected from the group consisting of oleic acid, hexanoic acid, octadecanoic acid, a mixture of oleic acid and oleylamine and a mixture of octadecanoic acid and stearylamine.

9. An optical material comprising a nanoparticle-resin composite material in which metal oxide nanoparticles are dispersed in a polymer, the metal oxide nanoparticles including an oxide of a metal selected from the group consisting of zirconium, niobium, indium, tin, cerium, hafnium, and tantalum, wherein the metal oxide nanoparticles are crystalline and have a particle diameter of $1\times10^{-8}$ m or less, wherein surfaces of the metal oxide nanoparticles are coated with a surfactant, and wherein the metal oxide nanoparticles are crystallized at a temperature greater than or equal to 200° C. and less than or equal to 400° C.

10. The optical material according to claim 9, wherein the metal oxide nanoparticles comprise:

core particles composed of the oxide; and a crystalline shell layer composed of an oxide of a metal selected from the group consisting of zirconium, niobium, indium, tin, cerium, hafnium, and tantalum, wherein the metal of the shell layer is different from the metal of the core particles, and wherein the crystalline shell layer coats the core particles and the surfactant coats the crystalline shell layer.

11. The optical material according to claim 9, wherein the surfactant is selected from the group consisting of: hexanoic acid, octanoic acid, decanoic acid, dodecanoic acid, hexadecanoic acid, octadecanoic acid (stearic acid), oleic acid, linoleic acid, benzoic acid, acetylbenzoic acid, diphenyl-4-benzoic acid, phenylacetic acid, diphenylacetic acid, methylbenzoic acid, butylbenzoic acid, phenoxyacetic acid, phenoxybenzoic acid, phenylbutyric acid, diphenylphosphinic acid, phenylphosphonic acid, benzenesulfonic acid, dodecylbenzenesulfonic acid, decanethiol, dodecanethiol, octadecanethiol, 1-adamantanecarboxylic acid, oleylamine, stearylamine, trioctylphosphine oxide, cetyltrimethylammonium chloride, cetyltrimethylammonium bromide, didodecyldimethylammonium bromide and mixtures thereof.

12. The optical material according to claim 9, wherein the surfactant is selected from the group consisting of oleic acid, hexanoic acid, octadecanoic acid, a mixture of oleic acid and oleylamine and a mixture of octadecanoic acid and stearylamine.

* * * * *